US012782624B2

(12) United States Patent
Kuwayama et al.

(10) Patent No.: US 12,782,624 B2
(45) Date of Patent: Nov. 3, 2026

(54) POLARIZING PLATE AND ORGANIC ELECTROLUMINESCENCE DISPLAY DEVICE

(71) Applicant: FUJIFILM Corporation, Tokyo (JP)

(72) Inventors: Yasukazu Kuwayama, Kanagawa (JP); Yuta Fukushima, Kanagawa (JP); Shinpei Yoshida, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 734 days.

(21) Appl. No.: 18/177,563

(22) Filed: Mar. 2, 2023

(65) Prior Publication Data

US 2023/0225176 A1 Jul. 13, 2023

Related U.S. Application Data

(63) Continuation of application No. PCT/JP2021/030773, filed on Aug. 23, 2021.

(30) Foreign Application Priority Data

Sep. 9, 2020 (JP) ................................ 2020-151536

(51) Int. Cl.
*G02B 5/30* (2006.01)
*H10K 59/80* (2023.01)

(52) U.S. Cl.
CPC ....... *G02B 5/3016* (2013.01); *H10K 59/8791* (2023.02)

(58) Field of Classification Search
CPC .... G02B 5/3016; G02B 5/30; H10K 59/8791; G09F 9/30; H05B 33/02
See application file for complete search history.

(56) References Cited

U.S. PATENT DOCUMENTS

2014/0284582 A1* 9/2014 Saitoh ............... G02F 1/133528 349/194
2017/0068031 A1 3/2017 Yoshizawa et al.
(Continued)

FOREIGN PATENT DOCUMENTS

CN 105807354 A * 7/2016 .............. G02B 5/30
JP 2002-151262 A 5/2002
(Continued)

OTHER PUBLICATIONS

Office Action, issued by the Japanese Patent Office on Oct. 22, 2024, in connection with Japanese Patent Application No. 2022-547476.
(Continued)

*Primary Examiner* — Charles S Chang
(74) *Attorney, Agent, or Firm* — Edwards Neils LLC; Jean C. Edwards, Esq.

(57) ABSTRACT

The present invention provides a polarizing plate that exhibits excellent black tightness in a front direction even after an organic EL display device obtained by bonding the polarizing plate to an organic EL display panel is exposed to a high temperature environment for a long period of time; and an organic EL display device. The polarizing plate of the present invention is a polarizing plate having a polarizer formed of a composition containing a first liquid crystal compound and a dichroic substance, and an optically anisotropic layer disposed adjacent to the polarizer and formed of a composition containing a second liquid crystal compound, in which a content of the dichroic substance in the polarizer is 40% by mass or less with respect to a total mass of the polarizer.

19 Claims, 5 Drawing Sheets

(56) References Cited

U.S. PATENT DOCUMENTS

| | | | | |
|---|---|---|---|---|
| 2018/0067232 | A1* | 3/2018 | Tan | G02B 5/3033 |
| 2021/0072443 | A1 | 3/2021 | Hoshino et al. | |
| 2021/0302773 | A1 | 9/2021 | Koito et al. | |

FOREIGN PATENT DOCUMENTS

| | | | |
|---|---|---|---|
| JP | 2014-209220 | A | 11/2014 |
| JP | 2015-227947 | A | 12/2015 |
| JP | 2019-168691 | A | 10/2019 |
| JP | 2020-023153 | A | 2/2020 |
| WO | 2016/194792 | A1 | 12/2016 |
| WO | 2019/225468 | A1 | 11/2019 |
| WO | 2020/122116 | A1 | 6/2020 |

OTHER PUBLICATIONS

Office Action, which was issued by the State Intellectual Property Office of China on May 17, 2025, in connection with Chinese Patent Application No. 202180054993.9.

Office Action, issued by the Japanese Patent Office on May 14, 2024, in connection with Japanese Patent Application No. 2022-547476.

International Search Report issued in PCT/JP2021/030773 on Oct. 5, 2021.

Written Opinion issued in PCT/JP2021/030773 on Oct. 5, 2021.

International Preliminary Report on Patentability completed by WIPO on Mar. 7, 2023 in connection with International Patent Application No. PCT/JP2021/030773.

Office Action, which was issued by the State Intellectual Property Office of China on Sep. 9, 2025, in connection with Chinese Patent Application No. 202180054993.9.

Office Action, which was issued by the Japanese Patent Office on May 12, 2026, in connection with Japanese Patent Application No. 2025-009107.

* cited by examiner

POLARIZING PLATE AND ORGANIC ELECTROLUMINESCENCE DISPLAY DEVICE

CROSS-REFERENCE TO RELATED APPLICATIONS

This application is a Continuation of PCT International Application No. PCT/JP2021/030773 filed on Aug. 23, 2021, which was published under PCT Article 21(2) in Japanese, and which claims priority under 35 U.S.C. § 119(a) to Japanese Patent Application No. 2020-151536 filed on Sep. 9, 2020. The above applications are hereby expressly incorporated by reference, in their entirety, into the present application.

BACKGROUND OF THE INVENTION

1. Field of the Invention

The present invention relates to a polarizing plate and an organic electroluminescent display device.

2. Description of the Related Art

An optically anisotropic layer having a phase difference is used in a great many applications. For example, since an organic electroluminescent (EL) display device has a structure using metal electrodes, external light may be reflected, resulting in problems of contrast reduction and reflected glare. Therefore, conventionally, a polarizing plate including an optically anisotropic layer and a polarizer has been used in order to suppress an adverse effect due to reflection of external light.

JP2020-023153A discloses a circularly polarizing plate in which a retardation layer (optically anisotropic layer) is bonded to a polarizer formed of a dichroic substance through a pressure sensitive adhesive layer.

SUMMARY OF THE INVENTION

On the other hand, in recent years, an organic EL display device is required to have excellent black tightness in a front direction, in order to further improve an image quality. In particular, the organic EL display device is required to have excellent black tightness in the front even after the organic EL display device is exposed to a high temperature environment for a long period of time. It should be noted that the term “black tightness” means that, in a case where an image display apparatus is brought into a black display state, the black tinting is suppressed and the reflectivity of reflected light is low.

As a result of preparing a circularly polarizing plate formed by bonding a polarizer and an optically anisotropic layer through a pressure sensitive adhesive layer, which is disclosed in JP2020-023153A, bonding the circularly polarizing plate to an organic EL display panel, and subjecting the obtained organic EL display device to a performance evaluation after long-term exposure of the organic EL display device to a high temperature environment, the present inventors have found that the organic EL display device did not sufficiently satisfy the above-mentioned requirements.

The present invention has been made in view of the above circumstances, and an object of the present invention is to provide a polarizing plate that exhibits excellent black tightness in a front direction even after an organic EL display device obtained by bonding the polarizing plate to an organic EL display panel is exposed to a high temperature environment for a long period of time.

Another object of the present invention is to provide an organic EL display device.

As a result of extensive studies on the problems of the related art, the present inventors have found that the foregoing objects can be achieved by the following configurations.

(1) A polarizing plate comprising a polarizer formed of a composition containing a first liquid crystal compound and a dichroic substance, and an optically anisotropic layer disposed adjacent to the polarizer and formed of a composition containing a second liquid crystal compound, in which a content of the dichroic substance in the polarizer is 40% by mass or less with respect to a total mass of the polarizer.

(2) The polarizing plate according to (1), in which the content of the dichroic substance in the polarizer is 30% by mass or less with respect to the total mass of the polarizer.

(3) The polarizing plate according to (1) or (2), in which an angle formed by an absorption axis of the polarizer and an in-plane slow axis on a surface of the optically anisotropic layer on a side of the polarizer is within 1°.

(4) The polarizing plate according to any one of (1) to (3), in which the optically anisotropic layer is a layer formed by fixing a twist-aligned second liquid crystal compound with a thickness direction as a helical axis.

(5) The polarizing plate according to any one of (1) to (4), in which the optically anisotropic layer has a plurality of layers formed by fixing a twist-aligned second liquid crystal compound with a thickness direction as a helical axis, and twisted angles of the second liquid crystal compound are different from each other in the plurality of layers.

(6) The polarizing plate according to any one of (1) to (5), in which the optically anisotropic layer has a plurality of layers formed by fixing a twist-aligned second liquid crystal compound with a thickness direction as a helical axis, and the plurality of layers each have a different ratio of the twisted angle of the second liquid crystal compound to a thickness of the layer.

(7) The polarizing plate according to any one of (1) to (6), in which the optically anisotropic layer has a first optically anisotropic layer and a second optically anisotropic layer, the first optically anisotropic layer is disposed on a side of the polarizer, the first optically anisotropic layer and the second optically anisotropic layer are layers formed by fixing the twist-aligned second liquid crystal compound with a thickness direction as a helical axis, a twisted direction of the second liquid crystal compound in the first optically anisotropic layer and a twisted direction of the second liquid crystal compound in the second optically anisotropic layer are the same, the twisted angle of the second liquid crystal compound in the first optically anisotropic layer is 26.5°±10.0°, the twisted angle of the second liquid crystal compound in the second optically anisotropic layer is 78.6°±10.0°, an in-plane slow axis on a surface of the first optically anisotropic layer on a second optically anisotropic layer side is parallel to an in-plane slow axis on a surface of the second optically anisotropic layer on a first optically anisotropic layer side, and a value of a product $\Delta n1 \cdot d1$ of a refractive index anisotropy $\Delta n1$ of the first optically anisotropic layer measured at a wavelength of 550 nm and a thickness d1 of the first optically anisotropic layer, and a value of a product $\Delta n2 \cdot d2$ of a refractive index anisotropy $\Delta n2$ of the second optically anisotropic layer measured at a wavelength of 550 nm and a thickness d2 of the second optically anisotropic layer satisfy Expression (1) and Expression (2), respectively.

$$252\ \text{nm} \leq \Delta n1 \cdot d1 \leq 312\ \text{nm} \quad \text{Expression (1)}$$

$$110\ \text{nm} \leq \Delta n2 \cdot d2 \leq 170\ \text{nm} \quad \text{Expression (2)}$$

(8) The polarizing plate according to any one of (1) to (7), in which, in a case of carrying out a component analysis in a depth direction of the polarizer by time-of-flight secondary ion mass spectrometry, a relationship between a maximum intensity Imax of a secondary ion intensity derived from the dichroic substance and an intensity Isur1 of the secondary ion intensity derived from the dichroic substance on a surface of the polarizer on a side opposite to the optically anisotropic layer satisfies Expression (3).

$$2.0 \leq I\text{max}/I\text{sur1} \quad \text{Expression (3)}$$

(9) The polarizing plate according to any one of (1) to (8), in which an absolute value of a difference between a log P of the second liquid crystal compound and a log P of the dichroic substance is 3.0 or more.

(10) An organic electroluminescent display device comprising the polarizing plate according to any one of (1) to (9).

According to an aspect of the present invention, it is possible to provide a polarizing plate that exhibits excellent black tightness in a front direction even after an organic EL display device obtained by bonding the polarizing plate to an organic EL display panel is exposed to a high temperature environment for a long period of time.

According to another aspect of the present invention, it is also possible to provide an organic EL display device.

DESCRIPTION OF THE PREFERRED EMBODIMENTS

Figure 1:
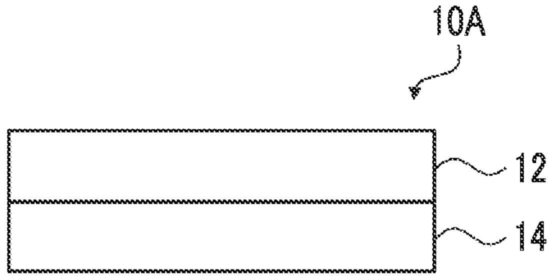
FIG. 1 is a schematic cross-sectional view of one embodiment of a polarizing plate of the present invention.

Hereinafter, the present invention will be described in more detail. Any numerical range expressed using "to" in the present specification refers to a range including the numerical values before and after the "to" as a lower limit value and an upper limit value, respectively. First, the terms used in the present specification will be described.

An in-plane slow axis is defined at 550 nm unless otherwise specified.

In the present invention, Re(λ) and Rth(λ) represent an in-plane retardation at a wavelength λ and a thickness direction retardation at a wavelength λ, respectively. The wavelength λ is 550 nm unless otherwise specified.

In the present invention, Re(λ) and Rth(λ) are values measured at a wavelength of λ in AxoScan (manufactured by Axometrics, Inc.). By inputting an average refractive index ((nx+ny+nz)/3) and a film thickness (d (μm)) in AxoScan, slow axis direction (°)

$$Re(\lambda)=R0(\lambda)$$

$$Rth(\lambda)=((nx+ny)/2-nz)\times d$$

are calculated.

Although R0(λ) is displayed as a numerical value calculated by AxoScan, R0(λ) means Re(λ).

In the present specification, the refractive indexes nx, ny, and nz are measured using an Abbe refractometer (NAR-4T, manufactured by Atago Co., Ltd.) and using a sodium lamp (λ=589 nm) as a light source. In addition, in a case of measuring the wavelength dependence, it can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. Examples of average refractive index values for major optical films are given below: cellulose acylate (1.48), cycloolefin polymer (1.52), polycarbonate (1.59), polymethyl methacrylate (1.49), and polystyrene (1.59).

The term "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB). Above all, an ultraviolet ray is preferable.

The term "visible light" in the present specification refers to light in a wavelength range of 380 to 780 nm. In addition, a measurement wavelength in the present specification is 550 nm unless otherwise specified.

In addition, in the present specification, a relationship between angles (for example, "orthogonal" or "parallel") is intended to include a range of errors acceptable in the art to which the present invention belongs. Specifically, it means that an angle is within an error range of less than ±10° with respect to the exact angle, and the error with respect to the exact angle is preferably within a range of ±5° or less and more preferably within a range of ±3° or less.

The bonding direction of the divalent group (for example, —C(O)O—) described in the present specification is not particularly limited. For example, in a case where L1 in Formula (1) which will be described later is —C(O)O— and then in a case where the position bonded to the P1 side is defined as *1 and the position bonded to the SP1 side is defined as *2, L1 may be *1-C(O)—O-*2 or *1-O—C(O)-*2.

A feature point of the polarizing plate according to the embodiment of the present invention is that a polarizer and an optically anisotropic layer are in direct contact with each other, and a concentration of a dichroic substance in the polarizer is a predetermined value or less.

The present inventors have examined the reason why the polarizing plate described in JP2020-023153A did not exhibit a desired effect. First, in a case where a pressure sensitive adhesive layer was interposed between a polarizer and an optically anisotropic layer, the reflection of light was likely to occur at the interface between the polarizer and the pressure sensitive adhesive layer and at the interface between the pressure sensitive adhesive layer and the optically anisotropic layer, which was one of the causes of deterioration in black tightness. In particular, the polarizer contained a dichroic substance having a relatively high refractive index, leading to an increase in refractive index of the polarizer itself, and therefore the difference in refractive index between adjacent pressure sensitive adhesive layers increased and the reflection of light was more likely to occur.

On the other hand, in the present invention, the polarizer and the optically anisotropic layer are brought into direct contact with each other to suppress the reflection of light derived from the pressure sensitive adhesive layer, and the concentration of the dichroic substance in the polarizer is set to a predetermined value or less to adjust the refractive index of the polarizer to a refractive index similar to that of the optically anisotropic layer, so that the reflection of light at the interface between the polarizer and the optically anisotropic layer is suppressed.

Hereinafter, the polarizing plate according to the embodiment of the present invention will be described with reference to the accompanying drawings.

FIG. 1 is a schematic cross-sectional view of one embodiment of the polarizing plate according to the embodiment of the present invention. A polarizing plate 10A has a polarizer 12 and an optically anisotropic layer 14. As shown in FIG. 1, the polarizer 12 and the optically anisotropic layer 14 are disposed adjacent to each other. That is, the polarizer 12 and the optically anisotropic layer 14 are disposed so as to be in direct contact with each other.

Here, the term "adjacent" means that the polarizer and the optically anisotropic layer are disposed without interposing another layer, such as a pressure sensitive adhesive layer, therebetween.

The aspect in which the polarizer 12 and the optically anisotropic layer 14 are disposed adjacent to each other can also be specified by using the time-of-flight secondary ion mass spectrometry as described below.

More specifically, first, while irradiating the polarizing plate with an ion beam from one surface of the polarizing plate toward the other surface of the polarizing plate, components in the depth direction of the polarizing plate are analyzed by the time-of-flight secondary ion mass spectrometry to obtain depth direction profiles of the secondary ion intensity derived from the component contained in the polarizer and the secondary ion intensity derived from the component contained in the optically anisotropic layer.

Figure 2:
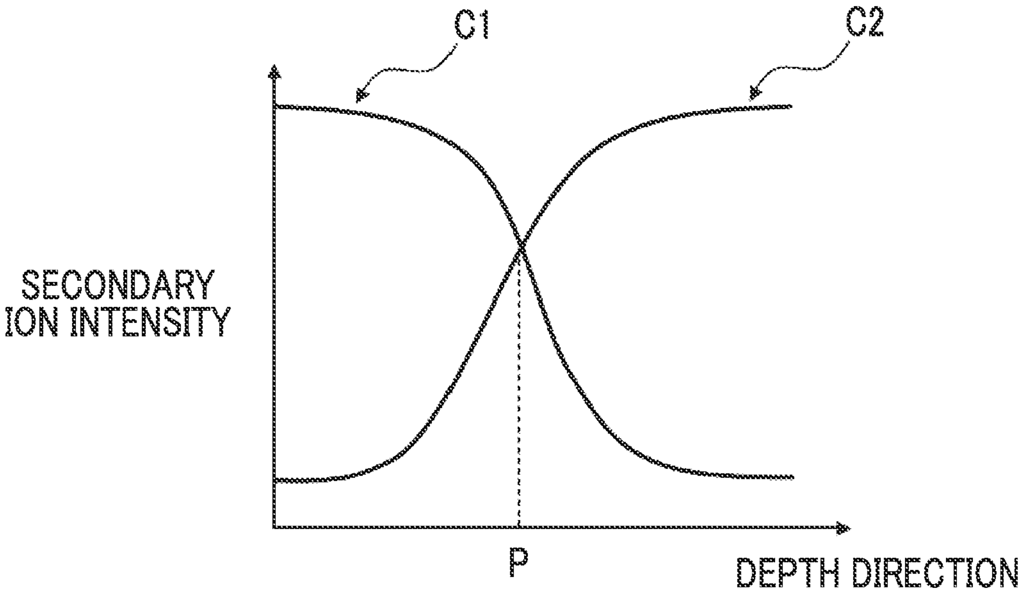
FIG. 2 is a schematic view for explaining a depth direction profile of a secondary ion intensity of each component detected by analyzing components in a depth direction of the polarizing plate by time-of-flight secondary ion mass spectrometry (TOF-SIMS).

FIG. 2 shows a profile obtained by analyzing the components in each layer in a depth direction by TOF-SIMS while carrying out ion sputtering from a surface of the polarizing plate on the polarizer side toward the optically anisotropic layer side. In the present specification, the term "depth direction" is intended to mean a direction toward the optically anisotropic layer side with reference to the surface of the polarizing plate on the polarizer side.

In the depth direction profile shown in FIG. 2, a lateral axis (an axis extending in a left-right direction of a paper surface in FIG. 2) represents a depth with reference to the surface of the polarizing plate on the polarizer side, and a vertical axis (an axis extending in a vertical direction of a paper surface in FIG. 2) represents a secondary ion intensity of each component.

The TOF-SIMS is specifically described in "Surface Analysis Technology Library Secondary Ion Mass Spectrometry" edited by the Surface Science Society of Japan and published by Maruzen Co., Ltd. (1999).

In a case of analyzing the components in the depth direction of the polarizing plate by TOF-SIMS while irradiating the polarizing plate with an ion beam, the series of operations are repeated including carrying out the component analysis in a surface depth region of 1 to 2 nm, then digging further in a depth direction from 1 nm to several hundred nm, and carrying out the component analysis in the next surface depth region of 1 to 2 nm.

The depth direction profile shown in FIG. 2 shows the result of the secondary ion intensity derived from the component contained in the polarizer (line C1 in the figure) and the result of the secondary ion intensity derived from the component contained in the optically anisotropic layer (line C2 in the figure).

In the present specification, with regard to the secondary ion intensity obtained by the depth direction profile detected by analyzing the components in the depth direction of the polarizing plate by TOF-SIMS, the "secondary ion intensity derived from the component contained in the polarizer" is intended to mean an intensity of fragment ions derived from the component contained in the polarizer, and the "secondary ion intensity derived from the component contained in the optically anisotropic layer" is intended to mean an intensity of fragment ions derived from the component contained in the optically anisotropic layer.

As shown in FIG. 2, in a case where the components in the depth direction of the polarizing plate are analyzed by TOF-SIMS while irradiating the polarizing plate with an ion beam from the surface of the polarizing plate on the polarizer side toward the optically anisotropic layer side, first, the secondary ion intensity derived from the component contained in the polarizer is observed to be high, and in a case where the polarizing plate is further irradiated with an ion beam in a depth direction, the secondary ion intensity gradually decreases. On the other hand, the secondary ion intensity derived from the component contained in the optically anisotropic layer gradually increases from a certain depth position, and after a predetermined depth position, the secondary ion intensity derived from the component contained in the polarizer is not observed, and the secondary ion intensity derived from the component contained in the optically anisotropic layer is observed to be high.

In a case where the polarizer and the optically anisotropic layer are adjacent to each other, a profile (line) indicating the secondary ion intensity derived from the component contained in the polarizer and a profile (line) indicating the secondary ion intensity derived from the component contained in the optically anisotropic layer intersects at a predetermined depth position P, as shown in FIG. 2. That is, there is a depth position, in the vicinity of the interface between the polarizer and the optically anisotropic layer, where the secondary ion intensity derived from the component contained in the polarizer and the secondary ion intensity derived from the component contained in the optically anisotropic layer exhibit the same intensity.

Examples of the measurement method for TOF-SIMS include known methods. For example, the measuring apparatus and the measuring conditions include the following.

Apparatus: TOF-SIMS 5 (manufactured by ION-TOF GmbH)

Depth direction analysis: Combined with Ar ion sputtering

Measurement range: Raster scan of 128 points each in one direction and in a direction orthogonal thereto.

Polarity: positive, negative

In addition, in a case of obtaining the profile of the secondary ion intensity, for example, a dichroic substance or a first liquid crystal compound is selected as the component contained in the polarizer.

In addition, a second liquid crystal compound is selected as the component contained in the optically anisotropic layer.

Hereinafter, each of members included in the polarizing plate will be described in detail.

<Polarizer>

The polarizer is formed of a composition containing a first liquid crystal compound and a dichroic substance (hereinafter, also referred to as a composition for forming a polarizer). In the polarizer, the dichroic substance is also aligned in a predetermined direction along the alignment of the first liquid crystal compound. In particular, it is preferable that the dichroic substance is horizontally aligned.

In the following, first, the material used for forming the polarizer will be described in detail.

(First Liquid Crystal Compound)

Both a high molecular weight liquid crystal compound and a low molecular weight liquid crystal compound can be used as the first liquid crystal compound. From the viewpoint that the alignment degree of the dichroic substance is higher, it is preferable to use a high molecular weight liquid crystal compound.

Here, the term "high molecular weight liquid crystal compound" refers to a liquid crystal compound having a repeating unit in a chemical structure thereof.

In addition, the term "low molecular weight liquid crystal compound" refers to a liquid crystal compound having no repeating unit in a chemical structure thereof.

Examples of the high molecular weight liquid crystal compound include thermotropic liquid crystalline polymers described in JP2011-237513A, and high molecular weight liquid crystal compounds described in paragraphs [0012] to [0042] of WO2018/199096A.

Examples of the low molecular weight liquid crystal compound include liquid crystal compounds described in paragraphs [0072] to [0088] of JP2013-228706A, among which a liquid crystal compound exhibiting smectic properties is preferable.

In addition, a high molecular weight liquid crystal compound and a low molecular weight liquid crystal compound may be used in combination as the first liquid crystal compound.

From the viewpoint that the alignment degree of the dichroic substance is higher, the first liquid crystal compound is preferably a high molecular weight liquid crystal compound containing a repeating unit represented by Formula (1) (hereinafter, also referred to simply as "repeating unit (1)").

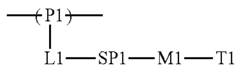

(1)

In Formula (1), P1 represents a main chain of the repeating unit, L1 represents a single bond or a divalent linking group, SP1 represents a spacer group, M1 represents a mesogen group, and T1 represents a terminal group.

Examples of the main chain of the repeating unit represented by P1 include groups represented by Formula (P1-A) to Formula (P1-D), among which a group represented by Formula (P1-A) is preferable from the viewpoint of the diversity of monomers as raw materials and the ease of handling.

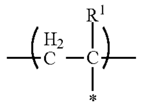

(P1-A)

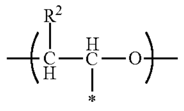

(P1-B)

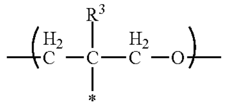

(P1-C)

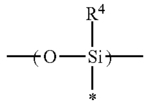

(P1-D)

In Formula (P1-A) to Formula (P1-D), "*" represents a bonding position with L1 in Formula (1).

In Formula (P1-A) to Formula (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group, or may be an alkyl group having a cyclic structure (cycloalkyl group). In addition, the number of carbon atoms in the alkyl group is preferably 1 to 5.

The group represented by Formula (P1-A) is preferably one unit of a partial structure of a poly(meth)acrylic acid ester obtained by polymerization of an (meth)acrylic acid ester.

The group represented by Formula (P1-B) is preferably an ethylene glycol unit formed by ring-opening polymerization of an epoxy group of a compound having an epoxy group.

The group represented by Formula (P1-C) is preferably a propylene glycol unit formed by ring-opening polymerization of an oxetane group of a compound having an oxetane group.

The group represented by Formula (P1-D) is preferably a siloxane unit of a polysiloxane obtained by condensation polymerization of a compound having at least one of an alkoxysilyl group or a silanol group. Here, the compound having at least one of an alkoxysilyl group or a silanol group may be, for example, a compound having a group represented by a formula of $SiR^4(OR^5)_2$—. In the formula, $R^4$ has the same definition as $R^4$ in Formula (P1-D), and a plurality of $R^5$'s each independently represent a hydrogen atom or an alkyl group having 1 to 10 carbon atoms.

In Formula (1), L1 is a single bond or a divalent linking group.

Examples of the divalent linking group represented by L1 include —C(O)O—, —O—, —S—, —C(O)$NR^6$—, —$SO_2$—, and —$NR^6R^7$—. In the formulae, $R^6$ and $R^7$ each independently represent a hydrogen atom or an alkyl group having 1 to 6 carbon atoms which may have a substituent.

In a case where P1 is a group represented by Formula (P1-A), L1 is preferably a group represented by —C(O)O— from the viewpoint that the alignment degree of the dichroic substance is higher.

In a case where P1 is a group represented by Formula (P1-B) to Formula (P1-D), L1 is preferably a single bond from the viewpoint that the alignment degree of the dichroic substance is higher.

In Formula (1), the spacer group represented by SP1 preferably contains at least one structure selected from the group consisting of an oxyethylene structure, an oxypropylene structure, a polysiloxane structure, and a fluorinated alkylene structure, from the viewpoint of easily exhibiting liquid crystallinity, availability of raw materials, and the like.

Here, the oxyethylene structure represented by SP1 is preferably a group represented by $*\text{—}(CH_2\text{—}CH_2O)_{n1}\text{—}*$. In the formula, n1 represents an integer of 1 to 20, and * represents a bonding position with L1 or M1 in Formula (1). From the viewpoint that the alignment degree of the dichroic substance is higher, n1 is preferably an integer of 2 to 10, more preferably an integer of 2 to 4, and most preferably 3.

In addition, the oxypropylene structure represented by SP1 is preferably a group represented by $*\text{—}(CH(CH_3)\text{—}CH_2O)_{n2}\text{—}*$ from the viewpoint that the alignment degree of the dichroic substance is higher. In the formula, n2 represents an integer of 1 to 3, and * represents a bonding position with L1 or M1.

In addition, the polysiloxane structure represented by SP1 is preferably a group represented by $*\text{—}(Si(CH_3)_2\text{—}O)_{n3}\text{—}*$ from the viewpoint that the alignment degree of the dichroic substance is higher. In the formula, n3 represents an integer of 6 to 10, and * represents a bonding position with L1 or M1.

In addition, the fluorinated alkylene structure represented by SP1 is preferably a group represented by $*\text{—}(CF_2\text{—}CF_2)_{n4}\text{—}*$ from the viewpoint that the alignment degree of the dichroic substance is higher. In the formula, n4 represents an integer of 6 to 10, and * represents a bonding position with L1 or M1.

In Formula (1), the mesogen group represented by M1 is a group exhibiting a main skeleton of a liquid crystal molecule that contributes to the formation of a liquid crystal. The liquid crystal molecule exhibits liquid crystallinity which is an intermediate state (mesophase) between a crystalline state and an isotropic liquid state. The mesogen group is not particularly limited, and reference can be made to, for example, "Flussige Kristalle in Tabellen II" (VEB Deutsche Verlag fur Grundstoff Industrie, Leipzig, 19th, 2000), particularly the description in Chapter 3 thereof.

For example, a group having at least one cyclic structure selected from the group consisting of an aromatic hydrocarbon group, a heterocyclic group, and an alicyclic group is preferable as the mesogen group.

From the viewpoint that the alignment degree of the dichroic substance is higher, the mesogen group preferably has an aromatic hydrocarbon group, more preferably 2 to 4 aromatic hydrocarbon groups, and still more preferably 3 aromatic hydrocarbon groups.

From the viewpoint of exhibiting liquid crystallinity, adjustment of liquid crystal phase transition temperature, availability of raw materials, and synthetic suitability, and from the viewpoint that the alignment degree of the dichroic substance is higher, the mesogen group is preferably a group represented by Formula (M1-A) or Formula (M1-B) and more preferably a group represented by Formula (M1-B).

$$*\text{—}(A1)_{a1}\text{—}* \quad \text{(M1-A)}$$

$$*\text{—}(A2\text{—}LA1)_{a2}\text{—}A3\text{—}* \quad \text{(M1-B)}$$

In Formula (M1-A), A1 is a divalent group selected from the group consisting of an aromatic hydrocarbon group, a heterocyclic group, and an alicyclic group. These groups may be substituted with an alkyl group, an alkyl fluoride group, an alkoxy group, or a substituent.

The divalent group represented by A1 is preferably a 4- to 6-membered ring. In addition, the divalent group represented by A1 may be a monocyclic ring or a fused ring.

* represents a bonding position with SP1 or T1.

Examples of the divalent aromatic hydrocarbon group represented by A1 include a phenylene group, a naphthylene group, a fluorene-diyl group, an anthracene-diyl group, and a tetracene-diyl group, among which a phenylene group or a naphthylene group is preferable and a phenylene group is more preferable, from the viewpoint of design diversity of a mesogen skeleton, availability of raw materials, and the like.

The divalent heterocyclic group represented by A1 may be either aromatic or non-aromatic, and is preferably a divalent aromatic heterocyclic group from the viewpoint that the alignment degree of the dichroic substance is higher.

Examples of the atom other than carbon that constitutes the divalent aromatic heterocyclic group include a nitrogen atom, a sulfur atom, and an oxygen atom. In a case where the aromatic heterocyclic group has a plurality of atoms forming a ring other than carbon, these atoms may be the same as or different from each other.

Examples of the divalent aromatic heterocyclic group include a pyridylene group (a pyridine-diyl group), a pyridazine-diyl group, an imidazole-diyl group, a thienylene group (a thiophene-diyl group), a quinolylene group (a quinoline-diyl group), an isoquinolylene group (an isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienoxazole-diyl group.

Examples of the divalent alicyclic group represented by A1 include a cyclopentylene group and a cyclohexylene group.

In Formula (M1-A), a1 represents an integer of 1 to 10. In a case where a1 is 2 or more, a plurality of A1's may be the same as or different from each other.

In Formula (M1-B), A2 and A3 are each independently a divalent group selected from the group consisting of an aromatic hydrocarbon group, a heterocyclic group, and an alicyclic group. Specific examples and suitable aspects of A2 and A3 are the same as those of A1 of Formula (M1-A), and thus the description thereof will be omitted.

In Formula (M1-B), a2 represents an integer of 1 to 10, and in a case where a2 is 2 or more, a plurality of A2's may be the same as or different from each other, and a plurality of LA1's may be the same as or different from each other. From the viewpoint that the alignment degree of the dichroic substance is higher, a2 is preferably an integer of 2 or more and more preferably 2.

In Formula (M1-B), LA1 is a divalent linking group in a case where a2 is 1. In a case where a2 is 2 or more, a plurality of LA1's are each independently a single bond or a divalent linking group, and at least one of the plurality of LA1's is a divalent linking group. In a case where a2 is 2, it is preferable that one of the two LA1's is a divalent linking group and the other of the two LA1's is a single bond, from the viewpoint that the alignment degree of the dichroic substance is higher.

In Formula (M1-B), examples of the divalent linking group represented by LA1 include —O—, $—(CH_2)_g—$, $—(CF_2)_g—$, $—Si(CH_3)_2—$, $—(Si)(CH_3)_2O)_g—$, $—(OSi(CH_3)_2)_g—$ (where g represents an integer of 1 to 10), —N(Z)—, —C(Z)=C(Z')—, —C(Z)=N—, —N=C(Z)—, $—C(Z)_2—C(Z')_2—$, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z")—, —C(Z)=C(Z')—C(O)—S—, —S—C(O)—C(Z)=C(Z)—, and —C(Z)=N—N=C(Z')— (where Z, Z', and Z" each independently represent a hydrogen atom, a C1-C4 alkyl group, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Above all, the divalent linking group represented by LA1 is preferably —C(O)O— from the viewpoint that the alignment degree of the dichroic substance is higher. LA1 may be a group in which two or more of these mentioned groups are combined.

In Formula (1), examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)— where R is an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureide group having 1 to 10 carbon atoms, and a (meth)acryloyloxy group-containing group. Examples of the (meth)acryloyloxy group-containing group include groups represented by -L-A (L represents a single bond or a linking group. Specific examples of the linking group are the same as those of L1 and SP1 described above. A represents a (meth)acryloyloxy group).

From the viewpoint that the alignment degree of the dichroic substance is higher, T1 is preferably an alkoxy group having 1 to 10 carbon atoms, more preferably an alkoxy group having 1 to 5 carbon atoms, and still more preferably a methoxy group.

These terminal groups may be further substituted with these groups or the polymerizable groups described in JP2010-244038A.

T1 is preferably a polymerizable group from the viewpoint that the adhesiveness between the polarizer and the optically anisotropic layer can be improved and the cohesive force as a film can be improved.

The polymerizable group is preferably a radically polymerizable group or a cationically polymerizable group.

A generally known radically polymerizable group can be used as the radically polymerizable group, and an acryloyl group or a methacryloyl group is preferable. In this case, an acryloyl group is generally known to have a high polymerization rate and therefore the acryloyl group is preferable from the viewpoint of improving productivity, but a methacryloyl group can also be used as the polymerizable group.

A generally known cationically polymerizable group can be used as the cationically polymerizable group, and examples thereof include an alicyclic ether group, a cyclic acetal group, a cyclic lactone group, a cyclic thioether group, a spiroorthoester group, and a vinyloxy group. Above all, an alicyclic ether group or a vinyloxy group is preferable, and an epoxy group, an oxetanyl group, or a vinyloxy group is more preferable.

The weight-average molecular weight (Mw) of the high molecular weight liquid crystal compound containing the repeating unit represented by Formula (1) is preferably 1,000 to 500,000 and more preferably 2,000 to 300,000. In a case where the Mw of the high molecular weight liquid crystal compound is within the above range, the high molecular weight liquid crystal compound can be easily handled.

In particular, from the viewpoint of suppressing the occurrence of cracks in a case of being coated, the weight-average molecular weight (Mw) of the high molecular weight liquid crystal compound is preferably 10,000 or more and more preferably 10,000 to 300,000.

In addition, from the viewpoint of the temperature latitude of the alignment degree, the weight-average molecular weight (Mw) of the high molecular weight liquid crystal compound is preferably less than 10,000 and more preferably 2,000 or more and less than 10,000.

Here, the weight-average molecular weight and the number-average molecular weight in the present invention are values measured by gel permeation chromatography (GPC).

Solvent (eluent): N-methylpyrrolidone

Device name: TOSOH HLC-8220GPC

Column: three TOSOH TSKgel Super AWM-H (6 mm×15 cm) connected in series

Column temperature: 25° C.

Sample concentration: 0.1% by mass

Flow rate: 0.35 mL/min

Calibration curve: calibration curve for 7 samples of TSK standard polystyrene, manufactured by Tosoh Corporation, Mw=2,800,000 to 1,050 (Mw/Mn=1.03 to 1.06)

The content of the first liquid crystal compound is preferably 50% by mass or more and more preferably 70% by mass or more with respect to the total solid content of the composition for forming a polarizer. The upper limit of the content of the first liquid crystal compound is not particularly limited, and is often 95% by mass or less.

Here, the "total solid content of the composition for forming a polarizer" refers to the components excluding a solvent in the composition for forming a polarizer, and specific examples of the solid content include the first liquid crystal compound described above, a dichroic substance, a polymerization initiator, and a surfactant, each of which will be described later.

(Dichroic Substance)

The dichroic substance is not particularly limited, and conventionally known dichroic substances (dichroic coloring agents) can be used including a visible light absorbing substance (a dichroic coloring agent), a luminescent substance (a fluorescent substance and a phosphorescent substance), an ultraviolet absorbing substance, an infrared absorbing substance, a nonlinear optical substance, a carbon nanotube, and an inorganic substance (for example, a quantum rod).

Examples of the dichroic substance include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more dichroic substances may be used in combination. For example, from the viewpoint of making the resulting polarizer closer to black, it is preferable to use at least one dichroic substance having a maximum absorption wavelength in a wavelength range of 370 nm or longer and shorter than 500 nm and at least one dichroic substance having a maximum absorption wavelength in a wavelength range of 500 nm or longer and shorter than 700 nm in combination.

The dichroic substance may have a crosslinkable group.

Examples of the crosslinkable group include a (meth) acryloyl group, an epoxy group, an oxetanyl group, and a styryl group, among which a (meth)acryloyl group is preferable.

The content of the dichroic substance is preferably 2 to 80 parts by mass and more preferably 5 to 30 parts by mass with respect to 100 parts by mass of the liquid crystal compound.

In addition, the content of the dichroic substance is preferably 1% to 40% by mass and more preferably 2% to 30% by mass in the solid content of the composition for forming a polarizer.

(Other Components)

The composition for forming a polarizer may contain components other than the first liquid crystal compound and the dichroic substance described above.

The composition for forming a polarizer preferably contains a polymerization initiator.

The polymerization initiator is not particularly limited, and is preferably a compound having photosensitivity, that is, a photopolymerization initiator.

Various compounds can be used as the photopolymerization initiator without any particular limitation. Examples of the photopolymerization initiator include α-carbonyl compounds (U.S. Pat. Nos. 2,367,661A and 2,367,670A), acyloin ethers (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), combinations of triarylimidazole dimers with p-aminophenyl ketones (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyl oxime compounds (JP2016-027384A, paragraph [0065]), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

In a case where the composition for forming a polarizer contains a polymerization initiator, the content of the polymerization initiator is preferably 0.01 to 30 parts by mass and more preferably 0.1 to 15 parts by mass with respect to a total of 100 parts by mass of the dichroic substance and the liquid crystal compound.

The composition for forming a polarizer preferably contains a surfactant.

The inclusion of the surfactant is expected to have the effects of improving the smoothness of the coated surface, further improving the alignment degree, suppressing cissing and unevenness, and improving the in-plane uniformity.

The surfactant is preferably a compound that makes the dichroic substance and the liquid crystal compound horizontal on the coating surface side, examples of which include the compounds described in paragraphs [0155] to [0170] of WO2016/099648A and the compounds (horizontal alignment agents) described in paragraphs [0253] to [0293] of JP2011-237513A.

In a case where the composition for forming a polarizer contains a surfactant, the content of the surfactant is preferably 0.001 to 5 parts by mass and more preferably 0.01 to 3 parts by mass with respect to a total of 100 parts by mass of the dichroic substance and the liquid crystal compound.

From the viewpoint of workability, the composition for forming a polarizer preferably contains a solvent.

Examples of the solvent include organic solvents such as ketones, ethers, aliphatic hydrocarbons, alicyclic hydrocarbons, aromatic hydrocarbons, carbon halides, esters, alcohols, cellosolves, cellosolve acetates, sulfoxides, amides, and heterocyclic compounds; and water. These solvents may be used alone or in combination of two or more thereof.

In a case where the composition for forming a polarizer contains a solvent, the content of the solvent is preferably 80% to 99% by mass and more preferably 83% to 97% by mass with respect to the total mass of the composition for forming a polarizer.

(Method for Producing Polarizer)

The method for producing a polarizer is not particularly limited as long as the composition for forming a polarizer is used. The method for producing a polarizer is preferably a method in which the composition for forming a polarizer is applied onto a predetermined support to form a coating film, and a liquid crystalline component in the coating film is aligned.

The liquid crystalline component is a component that includes not only the above-mentioned first liquid crystal compound but also a dichroic substance having liquid crystallinity in a case where the above-mentioned dichroic substance has liquid crystallinity.

The support onto which the composition for forming a polarizer is applied is not particularly limited. The support will be described in detail later.

The support may have an alignment layer on a surface thereof.

Examples of the method for forming an alignment film include methods such as rubbing treatment of a film surface of an organic compound (preferably a polymer), oblique vapor deposition of an inorganic compound, formation of a layer having microgrooves, and accumulation of an organic compound (for example, ω-tricosanoic acid, dioctadecylmethylammonium chloride, or methyl stearate) by the Langmuir-Blodgett method (LB film).

The alignment layer is preferably an alignment film formed by a rubbing treatment or a photo-alignment film formed by light irradiation.

A photo-alignment compound contained in the photo-alignment film may be, for example, a known material. A photosensitive compound having a photo-alignment group in which at least one of dimerization or isomerization occurs by the action of light is preferably used as the photo-alignment compound.

In addition, the composition for forming a polarizer may be applied onto an optically anisotropic layer which will be described later, in which case the optically anisotropic layer functions as an alignment film.

The method of applying the composition for forming a polarizer is not particularly limited, and includes a curtain coating method, a dip coating method, a spin coating method, a printing coating method, a spray coating method, a slot coating method, a roll coating method, a slide coating method, a blade coating method, a gravure coating method, and a wire bar method.

A method of aligning the liquid crystalline component in the coating film is not particularly limited, and is preferably a heat treatment.

From the viewpoint of manufacturing suitability, the heat treatment is preferably carried out at 10° C. to 250° C. and more preferably at 25° C. to 190° C. In addition, the heating time is preferably 1 to 300 seconds and more preferably 1 to 60 seconds.

A cooling treatment may be carried out after the heat treatment, if necessary. The cooling treatment is a treatment of cooling the coating film after heating to about room temperature (20° C. to 25° C.). Thereby, the alignment of the liquid crystalline component contained in the coating film can be fixed. The cooling means is not particularly limited and the cooling can be carried out by a known method.

In addition, if necessary, a curing treatment may be carried out after the liquid crystalline component is aligned.

In a case where the polarizer contains a crosslinkable group (polymerizable group), the curing treatment is carried out by heating and/or light irradiation (exposure to light).

(Properties of Polarizer)

The content of the dichroic substance in the polarizer is 40% by mass or less with respect to the total mass of the polarizer. Above all, from the viewpoint that the black tightening in a front direction is more excellent even after a display device including the polarizer of the present invention is exposed to a high temperature environment for a long period of time (hereinafter, also referred to as "the viewpoint that the effect of the present invention is more excellent"), the content of the dichroic substance is preferably 30% by mass or less with respect to the total mass of the polarizer. The lower limit of the content of the dichroic substance is not particularly limited, and is preferably 3% by mass or more and more preferably 5% by mass or more with respect to the total mass of the polarizer.

In a case of carrying out the component analysis in the depth direction of the polarizer by time-of-flight secondary ion mass spectrometry, the relationship between the maximum intensity Imax of the secondary ion intensity derived from the dichroic substance and the intensity Isur1 of the secondary ion intensity derived from the dichroic substance on the surface of the polarizer opposite to the optically anisotropic layer side preferably satisfies Expression (3), more preferably Expression (3-1), and still more preferably Expression (3-2). Satisfying the relationship of Expression (3) leads to an improvement in display performance and durability without providing a refractive index adjusting layer or a barrier layer (oxygen blocking layer), so it is possible to reduce the thickness of an organic EL display device.

$$2.0 \leq Imax/Isur1 \quad \text{Expression (3)}$$

$$5.0 \leq Imax/Isur1 \quad \text{Expression (3-1)}$$

$$10.0 < Imax/Isur1 \leq 100 \quad \text{Expression (3-2)}$$

The average value of the secondary ion intensities (the average value of the intensities from the baseline) of the fragments derived from the dichroic substance in the region of 1% from the surface of the polarizer opposite to the optically anisotropic layer side is defined as the intensity Isur1 on the viewing side surface.

In addition, the maximum value of the secondary ion intensity (intensity from the baseline) of the fragment derived from the dichroic substance in the region of 98% of the total thickness excluding the portion of 1% of the total thickness from each surface is defined as the maximum intensity Imax in a thickness direction.

The measurement method by time-of-flight secondary ion mass spectrometry may be, for example, the above-mentioned method.

In addition, in a case where two or more dichroic substances are contained in the polarizer, a secondary ion intensity of a fragment derived from a dichroic substance having a maximum absorption wavelength in a wavelength range of 500 to 650 nm (hereinafter, also referred to as "measurement target dichroic substance") is measured, and in a case where two or more measurement target dichroic substances are contained, a secondary ion intensity of a fragment derived from a dichroic substance having the highest absorbance among the measurement target dichroic substances is measured.

The thickness of the polarizer is not particularly limited, and is preferably 100 to 8,000 nm and more preferably 300 to 5,000 nm.

The thickness of the polarizer is intended to refer to an average thickness of the polarizer. The average thickness is obtained by measuring the thicknesses of any five or more points of the polarizer and arithmetically averaging the measured values.

<Optically Anisotropic Layer>

The optically anisotropic layer is formed of a composition containing a second liquid crystal compound (hereinafter, also referred to as a composition for forming an optically anisotropic layer).

In the following, first, the materials contained in the composition for forming an optically anisotropic layer will be described in detail.

(Second Liquid Crystal Compound)

Examples of the second liquid crystal compound include known liquid crystal compounds.

In general, the liquid crystal compound can be classified into a rod-like type and a disk-like type depending on the shape thereof. Further, there are a low molecular weight type and a high molecular weight type for each of the rod-like type and the disk-like type. The high molecular weight generally refers to having a polymerization degree of 100 or more (Polymer Physics-Phase Transition Dynamics, Masao Doi, p. 2, Iwanami Shoten Publishers, 1992).

The second liquid crystal compound is preferably a rod-like liquid crystal compound or a discotic liquid crystal compound and more preferably a rod-like liquid crystal compound.

For example, those described in claim 1 of JP1999-513019A (JP-H11-513019A) or paragraphs [0026] to [0098] of JP2005-289980A can be preferably used as the rod-like liquid crystal compound. For example, those described in paragraphs [0020] to [0067] of JP2007-108732A or paragraphs [0013] to [0108] of JP2010-244038A can be preferably used as the discotic liquid crystal compound. However, the present invention is not limited thereto.

The second liquid crystal compound preferably has a polymerizable group.

In addition, the type of the polymerizable group is not particularly limited, and is preferably a functional group capable of carrying out an addition polymerization reaction, among which a polymerizable ethylenic unsaturated group or a cyclic polymerizable group is preferable. More specifically, the polymerizable group is preferably a (meth)acryloyl group, a vinyl group, a styryl group, or an allyl group, and more preferably a (meth)acryloyl group. The (meth)acryloyl group is a notation that means a methacryloyl group or an acryloyl group.

In addition, a liquid crystal compound exhibiting reverse wavelength dispersibility can be used as the second liquid crystal compound.

Here, the liquid crystal compound exhibiting "reverse wavelength dispersibility" in the present specification refers to a liquid crystal compound in which an increase in an in-plane retardation (Re) value is equal to or higher than an increase in a measurement wavelength in a case where the Re value at a specific wavelength (visible light range) of a phase difference film prepared using this compound is measured.

In addition, the liquid crystal compound exhibiting reverse wavelength dispersibility is not particularly limited as long as it is capable of forming a film exhibiting reverse wavelength dispersibility as described above, and examples thereof include the compounds represented by General Formula (1) described in JP2010-084032A (in particular, the compounds described in paragraphs [0067] to [0073]), the compounds represented by General Formula (II) described in JP2016-053709A (in particular, the compounds described in paragraphs [0036] to [0043]), and the compounds represented by General Formula (1) described in JP2016-081035A (in particular, the compounds described in paragraphs [0043] to [0055]).

The absolute value of the difference between the log P of the second liquid crystal compound and the log P of the above-mentioned dichroic substance is not particularly limited, and is preferably 3.0 or more and more preferably 4.0 to 6.0 from the viewpoint that the effect of the present invention is more excellent. In a case where the absolute value of the difference is 3.0 or more, the dichroic substance in the polarizer is less likely to migrate to the optically anisotropic layer side.

In a case where a plurality of dichroic substances are used, it is preferable that the absolute value of the difference between the log P of the second liquid crystal compound and the log P of each dichroic substance is within the above range.

In addition, in a case where a plurality of second liquid crystal compounds are used, it is preferable that the absolute value of the difference between the log P of each second liquid crystal compound and the log P of the dichroic substance is within the above range.

Further, in a case where a plurality of second liquid crystal compounds and a plurality of dichroic substances are used, it is preferable that the absolute value of the difference between the log P of the second liquid crystal compound and the log P of the above-mentioned dichroic substance is within the above range for each of a plurality of combinations of the second liquid crystal compound and the dichroic substance.

The log P value is an indicator expressing the hydrophilicity and hydrophobicity of a chemical structure, and is sometimes referred to as a hydrophilic-hydrophobic parameter. The log P value of each compound can be calculated using software such as ChemBioDraw Ultra or HSPiP (Ver. 4.1.07). In addition, the log P value of the compound can also be experimentally obtained by, for example, the method described in OECD Guidelines for the Testing of Chemicals, Sections 1, Test No. 117. In the present invention, a value calculated by inputting a structural formula of a compound into HSPiP (Ver. 4.1.07) is adopted as the log P value, unless otherwise specified.

The content of the second liquid crystal compound is preferably 50% by mass or more and more preferably 70% by mass or more with respect to the total solid content of the composition for forming an optically anisotropic layer. The upper limit of the content of the second liquid crystal compound is not particularly limited, and is often 95% by mass or less.

Here, the "solid content of the composition for forming an optically anisotropic layer" refers to the components excluding a solvent in the composition for forming an optically anisotropic layer, and specific examples of the solid content include the second liquid crystal compound described above, a polymerization initiator which will be described later, and a surfactant.

(Other Components)

The composition for forming an optically anisotropic layer may contain components other than the second liquid crystal compound.

Examples of other components that may be contained in the composition for forming an optically anisotropic layer include a polymerization initiator, a surfactant, and a solvent, each of which may be contained in the composition for forming a polarizer.

The content of the polymerization initiator in the composition for forming an optically anisotropic layer is preferably 0.01% to 20% by mass and more preferably 0.3% to 10% by mass with respect to the total solid content of the composition for forming an optically anisotropic layer.

In addition, the composition for forming an optically anisotropic layer may contain a polymerizable monomer.

Examples of the polymerizable monomer include radically polymerizable or cationically polymerizable compounds. Above all, a polyfunctional radically polymerizable monomer is preferable. In addition, a monomer copolymerizable with the above-mentioned liquid crystal compound having a polymerizable group is preferable as the polymerizable monomer. For example, the polymerizable monomers described in paragraphs [0018] to [0020] of JP2002-296423A can be mentioned.

The content of the polymerizable monomer in the composition for forming an optically anisotropic layer is preferably 1% to 50% by mass and more preferably 2% to 30% by mass with respect to the total mass of the liquid crystal compound.

The composition for forming an optically anisotropic layer may contain various alignment control agents such as a vertical alignment agent and a horizontal alignment agent. These alignment control agents are compounds capable of horizontally or vertically controlling the alignment of a liquid crystal compound on the interface side.

(Method for Producing Optically Anisotropic Layer)

The method for producing an optically anisotropic layer is not particularly limited, and is preferably a method in which the composition for forming an optically anisotropic layer is applied onto a polarizer to form a coating film, the coating film is subjected to an alignment treatment to align the second liquid crystal compound, and the obtained coating film is subjected to a curing treatment (irradiation with ultraviolet rays (a light irradiation treatment) or a heat treatment) to form an optically anisotropic layer.

A polarizing plate in which the polarizer and the optically anisotropic layer are disposed adjacent to each other is produced by applying the composition for forming an optically anisotropic layer onto the polarizer, as described above.

The method of applying the composition for forming an optically anisotropic layer is not particularly limited, and examples thereof include the methods exemplified as the method of applying the composition for forming a polarizer described above.

Examples of the treatment for aligning the second liquid crystal compound include a treatment of drying the coating film at room temperature and a treatment of heating the coating film. In a case of a thermotropic liquid crystal compound, the liquid crystal phase formed by the alignment treatment can generally be transferred by a change in temperature or pressure. In a case of a lyotropic liquid crystal compound, the liquid crystal phase formed by the alignment treatment can also be transferred by a compositional ratio such as an amount of a solvent.

The conditions in a case of heating the coating film are not particularly limited, and the heating temperature is preferably 40° C. to 250° C. and more preferably 50° C. to 150° C., and the heating time is preferably 10 seconds to 10 minutes.

In addition, after the coating film is heated, the coating film may be cooled, if necessary, before a curing treatment (light irradiation treatment) which will be described later. The cooling temperature is preferably 20° C. to 200° C. and more preferably 30° C. to 150° C.

Next, the coating film in which the second liquid crystal compound is aligned is subjected to a curing treatment.

The method of the curing treatment carried out on the coating film in which the second liquid crystal compound is aligned is not particularly limited, and examples thereof include a light irradiation treatment and a heat treatment. Above all, from the viewpoint of manufacturing suitability, a light irradiation treatment is preferable, and an ultraviolet irradiation treatment is more preferable.

The irradiation conditions of the light irradiation treatment are not particularly limited, and an irradiation amount of 50 to 1,000 $mJ/cm^2$ is preferable.

(Properties of Optically Anisotropic Layer)

The thickness of the optically anisotropic layer is not particularly limited, and is preferably 10 μm or less, more preferably 0.5 to 8.0 μm, and still more preferably 0.5 to 6.0 μm from the viewpoint of reducing the thickness.

In the present specification, the thickness of the optically anisotropic layer is intended to refer to an average thickness of the optically anisotropic layer. The average thickness is obtained by measuring the thicknesses of any five or more points of the optically anisotropic layer and arithmetically averaging the measured values.

The optically anisotropic layer can also be used as a so-called λ/4 plate or λ/2 plate by adjusting the in-plane retardation.

The λ/4 plate is a plate having a function of converting linearly polarized light having a specific wavelength into circularly polarized light (or converting circularly polarized light having a specific wavelength into linearly polarized light). More specifically, the λ/4 plate is a plate whose in-plane retardation Re at a predetermined wavelength λ nm is λ/4 (or an odd multiple of λ/4).

The in-plane retardation (Re(550)) of the λ/4 plate at a wavelength of 550 nm may have an error of about 25 nm centered on an ideal value (137.5 nm), and is, for example, preferably 110 to 160 nm and more preferably 120 to 150 nm.

In addition, the λ/2 plate refers to an optically anisotropic film whose in-plane retardation Re(λ) at a specific wavelength λ nm satisfies $Re(\lambda) \approx \lambda/2$. This expression may be achieved at any wavelength (for example, 550 nm) in a visible light range. Above all, it is preferable that the in-plane retardation Re(550) at a wavelength of 550 nm satisfies the following relationship.

$$210\ nm \le Re(550) \le 300\ nm$$

The angle formed by the absorption axis of the above-mentioned polarizer and the in-plane slow axis on the surface of the optically anisotropic layer on the polarizer side is not particularly limited, and is preferably within 1° and more preferably within 0.5°. The lower limit thereof is not particularly limited, and may be, for example, 0°.

As will be described later, in a case of an aspect in which the optically anisotropic layer includes the first optically anisotropic layer and the second optically anisotropic layer, it is preferable that the angle formed by the absorption axis of the polarizer and the in-plane slow axis on the surface of the first optically anisotropic layer on the polarizer side is within the above range, from the viewpoint that the effect of the present invention is more excellent.

The direction of the absorption axis of the polarizer and the direction of the in-plane slow axis of the optically anisotropic layer are measured using an Axoscan (polarimeter) device of Axometrics, Inc. and using analysis software of Axometrics, Inc.

The optically anisotropic layer may be a layer formed by fixing a twist-aligned second liquid crystal compound with a thickness direction as a helical axis, or may be a layer formed by fixing a horizontally aligned second liquid crystal compound.

Above all, from the viewpoint that the effect of the present invention is more excellent, the optically anisotropic layer is preferably a layer formed by fixing a twist-aligned second liquid crystal compound with a thickness direction as a helical axis. The twisted angle of the second liquid crystal compound is not particularly limited, and is preferably more than 0° and less than 360°.

The "fixed" state is a state in which the alignment of a liquid crystal compound is maintained. Specifically, the "fixed" state is preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

The optically anisotropic layer may be composed of a single layer or may have a plurality of layers. That is, the optically anisotropic layer may be an aspect having a plurality of layers formed by fixing a twist-aligned second liquid crystal compound with a thickness direction as a helical axis.

The optically anisotropic layer is preferably composed of a plurality of layers having different twisted angles of the second liquid crystal compound.

It is preferable that the plurality of layers have different twisted angles of the second liquid crystal compound.

In addition, it is preferable that each of the plurality of layers has a different ratio of the twisted angle of the second liquid crystal compound to the thickness of the layer (the twisted angle (°) of the second liquid crystal compound/the thickness (μm) of the layer).

<Suitable Aspect of Polarizing Plate>

One suitable aspect of the polarizer may be, for example, an aspect in which the optically anisotropic layer has a first optically anisotropic layer and a second optically anisotropic layer, which will be described later.

Figure 3:
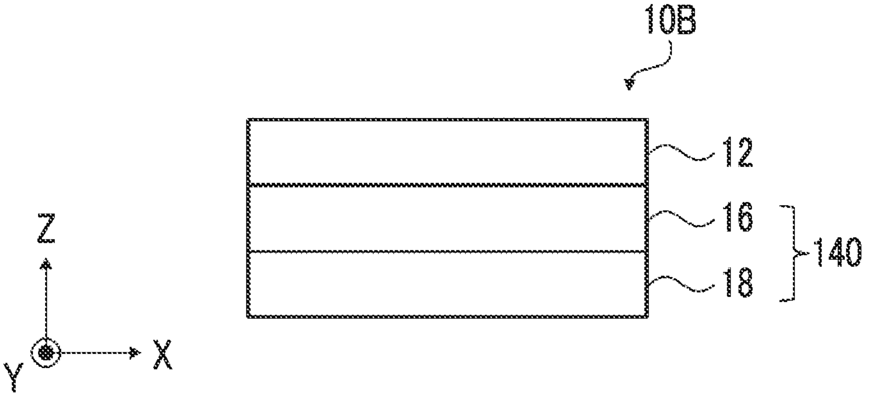
FIG. 3 is a schematic cross-sectional view of a suitable aspect of the polarizing plate of the present invention.

More specifically, as shown in FIG. 3, a polarizing plate 10B has a polarizer 12 and an optically anisotropic layer 140, and the optically anisotropic layer 140 has a first optically anisotropic layer 16 and a second optically anisotropic layer 18. In the optically anisotropic layer 140, the first optically anisotropic layer 16 is disposed closer to the polarizer 12 than the second optically anisotropic layer 18.

The polarizer 12 is the same as the polarizer 12 shown in FIG. 1 described above, and therefore the description thereof will be omitted.

In the following, the first optically anisotropic layer 16 and the second optically anisotropic layer 18 will be mainly described in detail.

(First Optically Anisotropic Layer)

The first optically anisotropic layer is a layer formed by fixing a twist-aligned second liquid crystal compound with a thickness direction (a z-axis direction in FIG. 3) as a helical axis. The first optically anisotropic layer is preferably a layer formed by fixing a so-called chiral nematic phase having a helical structure. In a case of forming the above phase, it is preferable to use a mixture of a second liquid crystal compound exhibiting a nematic liquid crystal phase and a chiral agent which will be described later.

The meaning of the "fixed" state is as described above.

The twisted angle of the second liquid crystal compound in the first optically anisotropic layer is 26.5°±10.0°, and is more preferably 26.5°±8.0° and still more preferably 26.5°±6.0° from the viewpoint that the effect of the present invention is more excellent.

In the present specification, the twisted angle is measured using an Axoscan (polarimeter) device of Axometrics, Inc. and using analysis software of Axometrics, Inc.

In addition, the expression "the second liquid crystal compound is twist-aligned" is intended to mean that the second liquid crystal compound from one main surface to the other main surface of the first optically anisotropic layer is twisted about the thickness direction of the first optically anisotropic layer. Along with this, the alignment direction (in-plane slow axis direction) of the second liquid crystal compound varies depending on the position in the thickness direction of the first optically anisotropic layer.

There are two types of twisted directions of the second liquid crystal compound in the first optically anisotropic layer, which may be a right-handed twist or a left-handed twist. In FIG. 3, the right-handed twist is intended to refer to a right-handed twist (twist clockwise) in a case of being observed from the second optically anisotropic layer toward the first optically anisotropic layer.

The value of a product Δn1·d1 of a refractive index anisotropy Δn1 of the first optically anisotropic layer measured at a wavelength of 550 nm and a thickness d1 of the first optically anisotropic layer satisfies Expression (1).

$$252\ \text{nm} \le \Delta n1 \cdot d1 \le 312\ \text{nm} \qquad \text{Expression (1)}$$

Above all, from the viewpoint that the effect of the present invention is more excellent, the Δn1·d1 preferably satisfies Expression (1A) and more preferably Expression (1B).

$$262\ \text{nm} \le \Delta n1 \cdot d1 \le 302\ \text{nm} \qquad \text{Expression (1A)}$$

$$272\ \text{nm} \le \Delta n1 \cdot d1 \le 292\ \text{nm} \qquad \text{Expression (1B)}$$

The Δn1·d1 is measured using an Axoscan (polarimeter) device of Axometrics, Inc. and using analysis software of Axometrics, Inc. in the same manner as the method for measuring the twisted angle.

(Second Optically Anisotropic Layer)

Similar to the first optically anisotropic layer, the second optically anisotropic layer is a layer formed by fixing a twist-aligned second rod-like liquid crystal compound with a thickness direction (a z-axis direction in FIG. 3) as a helical axis.

The twisted angle of the second liquid crystal compound is 78.6°±10.0°, and is more preferably 78.6°±8.0° and still more preferably 78.6°±6.0° from the viewpoint that the effect of the present invention is more excellent.

The twisted direction of the second liquid crystal compound in the second optically anisotropic layer is the same as the twisted direction of the second liquid crystal compound in the first optically anisotropic layer described above. For example, in a case where the twisted direction of the second liquid crystal compound in the first optically anisotropic layer is a right-handed twist, the twisted direction of the second liquid crystal compound in the second optically anisotropic layer is also a right-handed twist.

The value of a product Δn2·d2 of a refractive index anisotropy Δn2 of the second optically anisotropic layer measured at a wavelength of 550 nm and a thickness d2 of the second optically anisotropic layer satisfies Expression (2).

$$110\ \text{nm} \le \Delta n2 \cdot d2 \le 170\ \text{nm} \qquad \text{Expression (2)}$$

Above all, from the viewpoint that the effect of the present invention is more excellent, the Δn2·d2 preferably satisfies Expression (2A) and more preferably Expression (2B).

$$120\ \text{nm} \le \Delta n2 \cdot d2 \le 160\ \text{nm} \qquad \text{Expression (2A)}$$

$$130\ \text{nm} \le \Delta n2 \cdot d2 \le 150\ \text{nm} \qquad \text{Expression (2B)}$$

The Δn2·d2 is measured using an Axoscan (polarimeter) device of Axometrics, Inc. and using analysis software of Axometrics, Inc. in the same manner as the method for measuring the twisted angle.

The in-plane slow axis on the surface of the first optically anisotropic layer on the second optically anisotropic layer side is arranged parallel to the in-plane slow axis on the surface of the second optically anisotropic layer on the first optically anisotropic layer side. The definition of the "parallel" is as described above.

(Angle Relationship)

The absorption axis of the polarizer is parallel to the in-plane slow axis on the surface of the first optically anisotropic layer on the polarizer side.

The relationship among the absorption axis of the polarizer, the in-plane slow axis of the first optically anisotropic layer, and the in-plane slow axis of the second optically anisotropic layer will be described in more detail with reference to FIG. 4.

Figure 4:
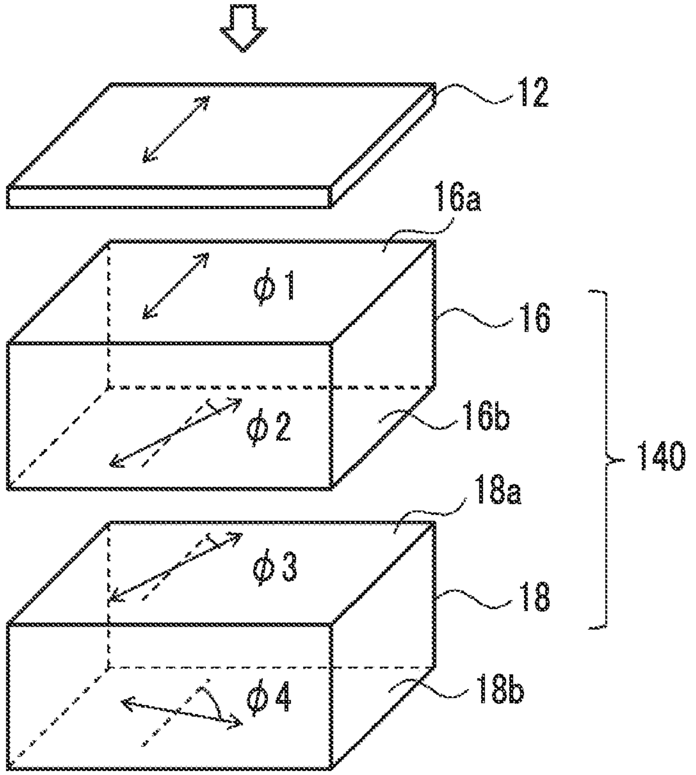
FIG. 4 is a view showing a relationship between an absorption axis of a polarizer 12 and an in-plane slow axis of each of a first optically anisotropic layer 16 and a second optically anisotropic layer 18 in a suitable aspect of the polarizing plate of the present invention.

In FIG. 4, an arrow in the polarizer 12 represents an absorption axis, and an arrow in the first optically anisotropic layer 16 and the second optically anisotropic layer 18 represents an in-plane slow axis in each layer. In addition, FIG. 5 shows a relationship of the angle among the absorption axis of the polarizer 12, the in-plane slow axis of the first optically anisotropic layer 16, and the in-plane slow axis of the second optically anisotropic layer 18 upon being observed from a white arrow in FIG. 4.

Figure 5:
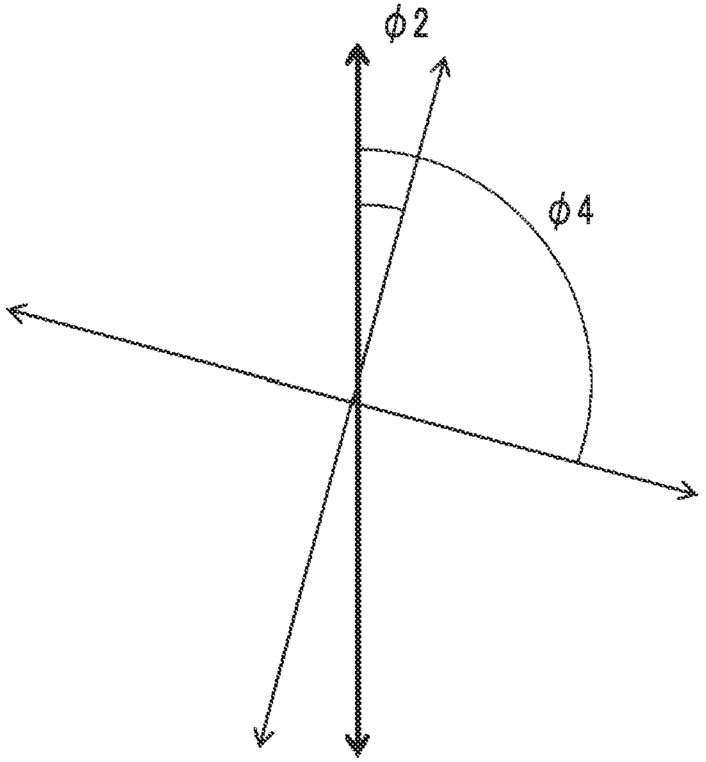
FIG. 5 is a schematic view showing a relationship of an angle between the absorption axis of the polarizer 12 and the in-plane slow axis of each of the first optically anisotropic layer 16 and the second optically anisotropic layer 18, upon being observed from the direction of an arrow in FIG. 4.

The rotation angle of the in-plane slow axis in FIG. 5 is represented by a positive value in a counterclockwise direction and a negative value in a clockwise direction, with reference to the absorption axis of the polarizer 12, upon being observed from the white arrow in FIG. 4.

In FIG. 4, the absorption axis of the polarizer 12 is parallel to the in-plane slow axis on a surface 16*a* of the first optically anisotropic layer 16 on the polarizer 12 side. The definition of the "parallel" is as described above.

As described above, the first optically anisotropic layer 16 is a layer formed by fixing a twist-aligned second liquid crystal compound with a thickness direction as a helical axis. Therefore, as shown in FIG. 4, the in-plane slow axis on the surface 16*a* of the first optically anisotropic layer 16 on the polarizer 12 side and the in-plane slow axis on a surface 16*b* of the first optically anisotropic layer 16 on the second optically anisotropic layer 18 side form the above-mentioned twisted angle (26.5° in FIG. 4). That is, the in-plane slow axis of the first optically anisotropic layer 16 rotates by −26.5° (26.5° clockwise). Therefore, an angle φ2 formed by the absorption axis of the polarizer 12 and the in-plane slow axis on the surface 16*b* of the first optically anisotropic layer 16 is 26.5°.

FIG. 5 shows an aspect in which the in-plane slow axis on the surface 16*b* of the first optically anisotropic layer 16 is rotated 26.5° clockwise with respect to the in-plane slow axis on the surface 16*a* of the first optically anisotropic layer 16, but the present invention is not limited to this aspect. The rotation angle may be in a range of 26.5°±10° clockwise.

In FIG. 4, the in-plane slow axis on the surface 16*b* of the first optically anisotropic layer 16 on the second optically anisotropic layer 18 side is parallel to the in-plane slow axis on a surface 18*a* of the second optically anisotropic layer 18 on the first optically anisotropic layer 16 side. That is, an angle φ3 formed by the absorption axis of the polarizer 12 and the in-plane slow axis on the surface 18*a* of the second optically anisotropic layer 18 on the first optically anisotropic layer 16 side is substantially the same as the angle φ2.

As described above, the second optically anisotropic layer 18 is a layer formed by fixing a twist-aligned liquid crystal compound with a thickness direction as a helical axis. Therefore, as shown in FIG. 4, the in-plane slow axis on the surface 18*a* of the second optically anisotropic layer 18 on the first optically anisotropic layer 16 side and the in-plane slow axis on a surface 18*b* of the second optically anisotropic layer 18 opposite to the first optically anisotropic layer 16 side form the above-mentioned twisted angle (78.6° in FIG. 4). That is, the in-plane slow axis of the second optically anisotropic layer 18 rotates by −78.6° (78.6° clockwise). Therefore, an angle φ4 formed by the absorption axis of the polarizer 12 and the in-plane slow axis on the surface 18*b* of the second optically anisotropic layer 18 is 105.1°.

FIG. 4 shows an aspect in which the in-plane slow axis on the surface 18*b* of the second optically anisotropic layer 18 is rotated 78.6° clockwise with respect to the in-plane slow axis on the surface 18*a* of the second optically anisotropic layer 18, but the present invention is not limited to this aspect. The rotation angle may be in a range of −78.6°±10° clockwise.

As described above, in the aspect of FIG. 4, the twisted directions of the second liquid crystal compounds in the first optically anisotropic layer 16 and the second optically anisotropic layer 18 are both clockwise (right-handed twist) with reference to the absorption axis of the polarizer 12.

In FIG. 4, the aspect in which the twisted direction is clockwise (right-handed twist) has been described in detail, but it may be an aspect in which the twisted directions of the second liquid crystal compounds in the first optically anisotropic layer 16 and the second optically anisotropic layer 18 are both counterclockwise.

(Method for Producing Suitable Aspect)

The method for producing a suitable aspect of the optically anisotropic layer including the first optically anisotropic layer and the second optically anisotropic layer is not particularly limited, and the following step 1 to step 5 may be carried out. The optically anisotropic layer including the first optically anisotropic layer and the second optically anisotropic layer can be produced in one coating step by carrying out the following step 1 to step 5.

Step 1: a step of applying a polymerizable liquid crystal composition containing a chiral agent including at least a photosensitive chiral agent whose helical twisting power changes upon irradiation with light, and a liquid crystal compound having a polymerizable group (hereinafter, also simply referred to as "liquid crystal compound" in the description of step 1 to step 5) onto a polarizer to form a composition layer Step 2: a step of subjecting the composition layer to a heat treatment to twist-align the liquid crystal compound in the composition layer along a helical axis extending along a thickness direction Step 3: a step of subjecting the composition layer to light irradiation under a condition of an oxygen concentration of 1% by volume or more, after the step 2

Step 4: a step of subjecting the composition layer to a heat treatment, after the step 3

Step 5: a step of subjecting the composition layer to a curing treatment to fix an alignment state of the liquid crystal compound to form a first optically anisotropic layer and a second optically anisotropic layer, after the step 4

Hereinafter, the procedure of each of the above steps will be described in detail.

[Step 1]

The step 1 is a step of applying a polymerizable liquid crystal composition containing a chiral agent including at least a photosensitive chiral agent whose helical twisting power changes upon irradiation with light and a liquid crystal compound having a polymerizable group onto a polarizer to form a composition layer. Carrying out this step leads to the formation of a composition layer to be subjected to a light irradiation treatment which will be described later.

Examples of various components contained in the polymerizable liquid crystal composition include components that may be contained in the above-mentioned composition for forming an optically anisotropic layer. Hereinafter, the photosensitive chiral agent not described above will be described in detail.

The helical twisting power (HTP) of the chiral agent is a factor indicating a helical alignment ability expressed by Expression (X).

HTP=1/(length (unit: μm) of helical pitch×concentration (% by mass) of chiral agent with respect to liquid crystal compound) [$\mu m^{-1}$]     Expression (X)

The length of the helical pitch refers to a length of pitch P(=the period of the helix) of a helical structure of the cholesteric liquid crystalline phase and can be measured by the method described in Liquid Crystal Handbook (published by Maruzen Co., Ltd.), p. 196.

The photosensitive chiral agent whose helical twisting power changes upon irradiation with light (hereinafter, also simply referred to as "chiral agent A") may be liquid crystalline or non-liquid crystalline. The chiral agent A generally contains an asymmetric carbon atom in many cases. The chiral agent A may be an axially asymmetric compound or planarly asymmetric compound that does not contain an asymmetric carbon atom.

The chiral agent A may have a polymerizable group.

The chiral agent A may be a chiral agent whose helical twisting power increases upon irradiation with light, or may be a chiral agent whose helical twisting power decreases upon irradiation with light. Above all, a chiral agent whose helical twisting power decreases upon irradiation with light is preferable.

The "increase and decrease in helical twisting power" in the present specification represents an increase or a decrease in helical twisting power in a case where an initial helical direction (helical direction before irradiation with light) of the chiral agent A is defined as "positive". Therefore, even in a case where the helical twisting power of a chiral agent continues to decrease and goes below 0 upon irradiation with light and therefore the helical direction is "negative" (that is, even in a case where a chiral agent induces a helix in a helical direction opposite to an initial helical direction (helical direction before irradiation with light)), such a chiral agent also corresponds to the "chiral agent whose helical twisting power decreases".

The chiral agent A may be, for example, a so-called photoreactive chiral agent. The photoreactive chiral agent is a compound that has a chiral site and a photoreactive site undergoing a structural change upon irradiation with light and greatly changes a twisting power of a liquid crystal compound according to an irradiation amount, for example.

Above all, the chiral agent A is preferably a compound having at least a photoisomerization site, and the photoisomerization site more preferably has a photoisomerizable double bond. The photoisomerization site having a photoisomerizable double bond is preferably a cinnamoyl site, a chalcone site, an azobenzene site, or a stilbene site from the viewpoint that photoisomerization is likely to occur and the difference in helical twisting power before and after irradiation with light is large; and more preferably a cinnamoyl site, a chalcone site, or a stilbene site from the viewpoint that the absorption of visible light is small. The photoisomerization site corresponds to the above-mentioned photoreactive site that undergoes a structural change upon irradiation with light.

The chiral agent A is preferably a compound represented by Formula (C).

R-L-R     Formula (C)

R's each independently represent a group having at least one site selected from the group consisting of a cinnamoyl site, a chalcone site, an azobenzene site, and a stilbene site.

L represents a divalent linking group formed by removing two hydrogen atoms from a structure represented by Formula (D) (a divalent linking group formed by removing two hydrogen atoms from the binaphthyl partial structure), a divalent linking group represented by Formula (E) (a divalent linking group consisting of the isosorbide partial structure), or a divalent linking group represented by Formula (F) (a divalent linking group consisting of the isomannide partial structure).

In Formula (E) and Formula (F), * represents a bonding position.

Formula (D)

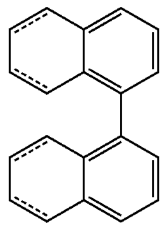

Formula (E)

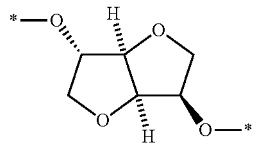

Formula (F)

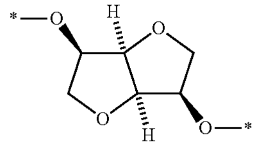

At least the above-mentioned chiral agent A is used in the step 1. The step 1 may be an aspect in which two or more chiral agents A are used, or may be an aspect in which at least one chiral agent A and at least one chiral agent whose helical twisting power does not change upon irradiation with light (hereinafter, simply referred to as "chiral agent B") are used.

The chiral agent B may be liquid crystalline or non-liquid crystalline. The chiral agent B generally contains an asymmetric carbon atom in many cases. The chiral agent B may be an axially asymmetric compound or planarly asymmetric compound that does not contain an asymmetric carbon atom.

The chiral agent B may have a polymerizable group.

A known chiral agent can be used as the chiral agent B.

The chiral agent B is preferably a chiral agent that induces a helix in a direction opposite to the direction of the helix induced by the chiral agent A. That is, for example, in a case where the helix induced by the chiral agent A is right-handed, the helix induced by the chiral agent B is left-handed.

The content of the chiral agent A in the composition layer is not particularly limited, and is preferably 5.0% by mass or less, more preferably 3.0% by mass or less, still more preferably 2.0% by mass or less, particularly preferably less than 1.0% by mass, more particularly preferably 0.8% by mass or less, and most preferably 0.5% by mass or less with respect to the total mass of the liquid crystal compound, from the viewpoint that the liquid crystal compound is easily aligned uniformly. The lower limit of the content of the chiral agent A is not particularly limited, and is preferably 0.01% by mass or more, more preferably 0.02% by mass or more, and still more preferably 0.05% by mass or more.

The chiral agent A may be used alone or in combination of two or more thereof. In a case where two or more chiral agents A are used in combination, the total content thereof is preferably within the above range.

The content of the chiral agent B in the composition layer is not particularly limited, and is preferably 5.0% by mass or less, more preferably 3.0% by mass or less, still more preferably 2.0% by mass or less, particularly preferably less than 1.0% by mass, more particularly preferably 0.8% by mass or less, and most preferably 0.5% by mass or less with respect to the total mass of the liquid crystal compound, from the viewpoint that the liquid crystal compound is easily aligned uniformly. The lower limit of the content of the chiral agent B is not particularly limited, and is preferably 0.01% by mass or more, more preferably 0.02% by mass or more, and still more preferably 0.05% by mass or more.

The chiral agent B may be used alone or in combination of two or more thereof. In a case where two or more chiral agents B are used in combination, the total content thereof is preferably within the above range.

The total content of the chiral agent (total content of all chiral agents) in the composition layer is preferably 5.0% by mass or less, more preferably 4.0% by mass or less, still more preferably 2.0% by mass or less, and particularly preferably 1.0% by mass or less with respect to the total mass of the liquid crystal compound. The lower limit of the content of the chiral agent B is not particularly limited, and is preferably 0.01% by mass or more, more preferably 0.02% by mass or more, and still more preferably 0.05% by mass or more.

The method of applying a polymerizable liquid crystal composition to form a composition layer is not particularly limited and may be, for example, the above-mentioned method of applying a composition for forming a polarizer.

The film thickness of the composition layer is not particularly limited and is preferably 0.1 to 20 μm, more preferably 0.2 to 15 μm, and still more preferably 0.5 to 10 μm.

(Step 2)

The step 2 is a step of subjecting the composition layer to a heat treatment to twist-align the polymerizable liquid crystal compound in the composition layer along a helical axis extending along a thickness direction.

With regard to the heat treatment conditions, the optimum conditions are selected according to the liquid crystal compound used.

Above all, the heating temperature is often 10° C. to 250° C., more often 40° C. to 150° C., and still more often 50° C. to 130° C.

The heating time is often 0.1 to 60 minutes and more often 0.2 to 5 minutes.

The absolute value of the weighted average helical twisting power of the chiral agent in the composition layer formed in the step 1 is preferably more than 0 $\mu m^{-1}$, more preferably more than 0 $\mu m^{-1}$ and 1.9 $\mu m^{-1}$ or less, still more preferably more than 0 $\mu m^{-1}$ and 1.5 $\mu m^{-1}$ or less, and particularly preferably more than 0.00 $\mu m^{-1}$ and 1.0 $\mu m^{-1}$ or less.

The weighted average helical twisting power of the chiral agent is a total value obtained by dividing the product of a helical twisting power of each chiral agent contained in the composition layer and a concentration (% by mass) of each chiral agent in the composition layer by a total concentration (% by mass) of the chiral agents in the composition layer, in a case where two or more chiral agents are contained in the composition layer. The weighted average helical twisting power is represented by Expression (Y), for example, in a case where two chiral agents (chiral agent X and chiral agent Y) are used in combination.

Weighted average helical twisting power ($\mu m^{-1}$)=(helical twisting power ($\mu m^{-1}$) of chiral agent *X*×concentration (% by mass) of chiral agent *X* in composition layer+helical twisting power ($\mu m^{-1}$) of chiral agent *Y*×concentration (% by mass) of chiral agent *Y* in composition layer)/(concentration (% by mass) of chiral agent *X* in composition layer+concentration (% by mass) of chiral agent *Y* in composition layer) Expression (Y)

However, in Expression (Y), in a case where the helical direction of the chiral agent is right-handed, the helical twisting power has a positive value. In addition, in a case where the helical direction of the chiral agent is left-handed, the helical twisting power has a negative value. That is, for example, in a case of a chiral agent having a helical twisting power of 10 $\mu m^{-1}$, the helical twisting power is expressed as 10 $\mu m^{-1}$ in a case where the helical direction of the helix induced by the chiral agent is right-handed. On the other hand, in a case where the helical direction of the helix induced by the chiral agent is left-handed, the helical twisting power is expressed as −10 $\mu m^{-1}$.

Figure 6:
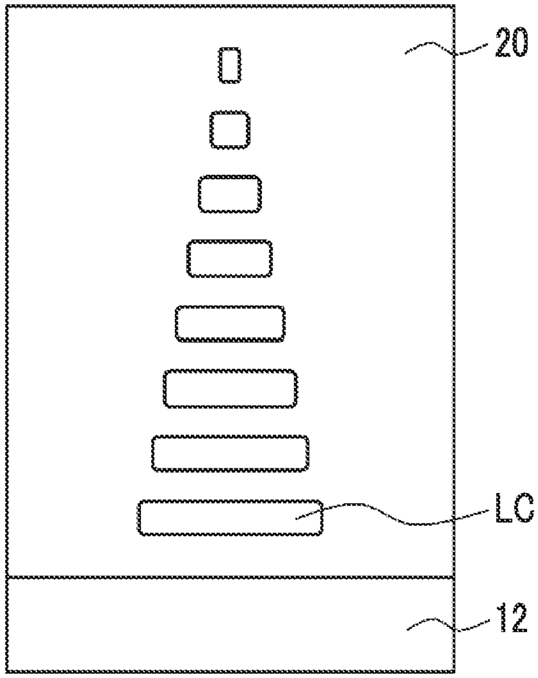
FIG. 6 is a cross-sectional view of a composition layer for explaining a step 1.

In a case where the absolute value of the weighted average helical twisting power of the chiral agent in the composition layer formed in the step 1 is more than 0 $\mu m^{-1}$, a composition layer 20 in which a liquid crystal compound LC is twist-aligned along a helical axis extending along a thickness direction is formed on the polarizer 12, as shown in FIG. 6.

FIG. 6 is a schematic cross-sectional view of the polarizer 12 and the composition layer 20. It is assumed that the chiral agent A and the chiral agent B are present in the composition layer 20 shown in FIG. 6, the concentration of the chiral agent B is higher than that of the chiral agent A, the helical direction induced by the chiral agent A is left-handed, and the helical direction induced by the chiral agent B is right-handed. In addition, the absolute value of the helical twisting power of the chiral agent A and the absolute value of the helical twisting power of the chiral agent B are assumed to be the same.

(Step 3)

The step 3 is a step of subjecting the composition layer to light irradiation in the presence of oxygen, after the step 2. In the following, the mechanism of this step will be described with reference to the accompanying drawings.

Figure 7:
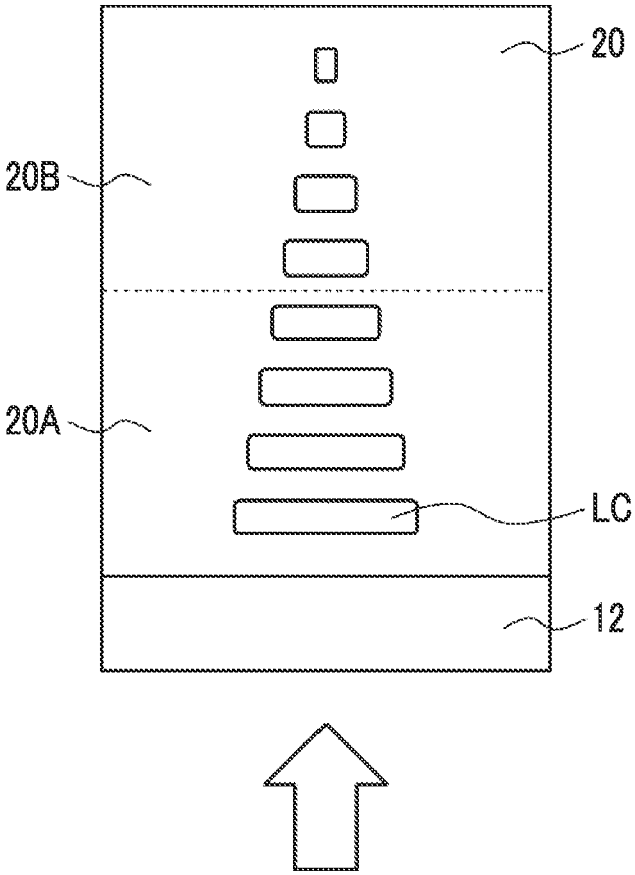
FIG. 7 is a cross-sectional view of the composition layer for explaining a step 2.

As shown in FIG. 7, in the above-mentioned step 2, light irradiation is carried out from the direction opposite to the composition layer 20 side of the polarizer 12 (the direction of the white arrow in FIG. 7) under the condition that the oxygen concentration is 1% by volume or more. Although the light irradiation is carried out from the polarizer 12 side in FIG. 7, the light irradiation may be carried out from the composition layer 20 side.

At that time, in a case where a first region 20A of the composition layer 20 on the polarizer 12 side and a second region 20B of the composition layer 20 opposite to the polarizer 12 side are compared, the surface of the second region 20B is on the air side, so that the oxygen concentration in the second region 20B is high and the oxygen concentration in the first region 20A is low. Therefore, in a case where the composition layer 20 is irradiated with light, the polymerization of the liquid crystal compound readily proceeds in the first region 20A, and the alignment state of the liquid crystal compound is fixed. The chiral agent A is also present in the first region 20A, and the chiral agent A is also photosensitized, resulting in a change in the helical twisting power. However, since the alignment state of the liquid crystal compound is fixed in the first region 20A, there is no change in the alignment state of the liquid crystal compound even in a case where the step 4 of subjecting the light-irradiated composition layer to a heat treatment, which will be described later, is carried out.

In addition, since the oxygen concentration is high in the second region 20B, the polymerization of the liquid crystal compound is inhibited by oxygen and therefore the polymerization does not proceed easily even in a case where light irradiation is carried out. Since the chiral agent A is also present in the second region 20B, the chiral agent A is photosensitized, resulting in a change in the helical twisting power. Therefore, in a case where the step 4 (heat treatment) which will be described later is carried out, the alignment state of the liquid crystal compound changes along with the changed helical twisting power.

That is, the fixation of the alignment state of the liquid crystal compound is likely to proceed in the region of the composition layer on the polarizer side by carrying out the step 3. In addition, the fixation of the alignment state of the liquid crystal compound is difficult to proceed in the region of the composition layer opposite to the polarizer side, and the helical twisting power changes according to the photosensitized chiral agent A.

The step 3 is carried out under the condition that the oxygen concentration is 1% by volume or more. Above all, the oxygen concentration is preferably 2% by volume or more and more preferably 5% by volume or more from the viewpoint that regions having different alignment states of the liquid crystal compound are likely to be formed in the optically anisotropic layer. The upper limit of the oxygen concentration is not particularly limited and may be, for example, 100% by volume.

The irradiation intensity of the light irradiation in the step 3 is not particularly limited and can be appropriately determined based on the helical twisting power of the chiral agent A. The irradiation amount of light irradiation in the step 3 is not particularly limited, and is preferably 300 $mJ/cm^2$ or less and more preferably 200 $mJ/cm^2$ or less from the viewpoint that a predetermined optically anisotropic layer is easily formed. The lower limit of the irradiation amount is preferably 5 $mJ/cm^2$ or more and more preferably 10 $mJ/cm^2$ or more from the viewpoint that a predetermined optically anisotropic layer is easily formed.

The light irradiation in the step 3 is preferably carried out at 15° C. to 70° C. (preferably 15° C. to 50° C.).

The light used for the light irradiation may be any light by which the chiral agent A is photosensitized. That is, the light used for the light irradiation is not particularly limited as long as it is an actinic ray or radiation that changes the helical twisting power of the chiral agent A, and examples thereof include an emission line spectrum of a mercury lamp, a far ultraviolet ray represented by an excimer laser, an extreme ultraviolet ray, an X-ray, an ultraviolet ray, and an electron beam. Above all, an ultraviolet ray is preferable.

(Step 4)

The step 4 is a step of subjecting the composition layer to a heat treatment, after the step 3. Carrying out this step leads to a change in the alignment state of the liquid crystal compound in the region where the helical twisting power of the chiral agent A in the composition layer subjected to light irradiation changes.

In the following, the mechanism of this step will be described with reference to the accompanying drawings.

As described above, in a case where the step 3 is carried out on the composition layer 20 shown in FIG. 7, the alignment state of the liquid crystal compound is fixed in the first region 20A, whereas the polymerization of the liquid crystal compound is difficult to proceed in the second region 20B and therefore the alignment state of the liquid crystal compound is not fixed. In addition, the helical twisting power of the chiral agent A changes in the second region 20B. In a case where such a change in the helical twisting power of the chiral agent A occurs, the force of twisting the liquid crystal compound changes in the second region 20B, as compared with the state before light irradiation. This point will be described in more detail.

As described above, the chiral agent A and the chiral agent B are present in the composition layer 20 shown in FIG. 6, the concentration of the chiral agent B is higher than that of the chiral agent A, the helical direction induced by the chiral agent A is left-handed, and the helical direction induced by the chiral agent B is right-handed. In addition, the absolute value of the helical twisting power of the chiral agent A and the absolute value of the helical twisting power of the chiral agent B are the same. Therefore, the weighted average helical twisting power of the chiral agent in the composition layer before the irradiation with light shows a positive value.

Figure 8:
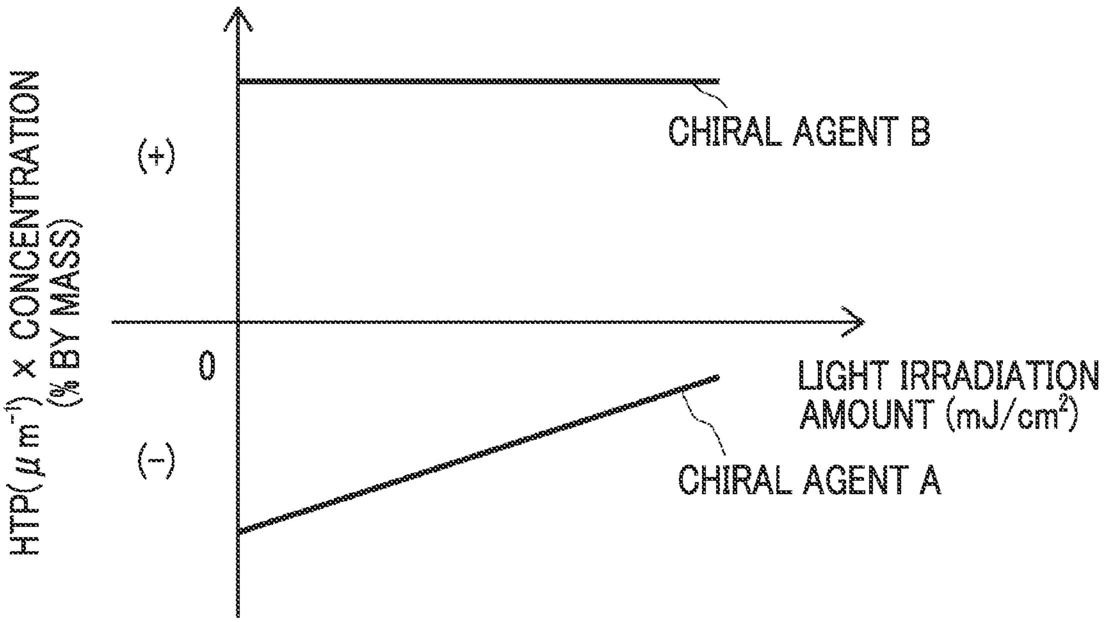
FIG. 8 is a schematic view of a graph plotting a relationship between a helical twisting power (HTP) ($\mu m^{-1}$)×a concentration (% by mass) and a light irradiation amount ($mJ/cm^2$) for each of a chiral agent A and a chiral agent B.

The above aspect is shown in FIG. 8. In FIG. 8, the vertical axis represents the "helical twisting power ($\mu m^{-1}$) of chiral agent x concentration (% by mass) of chiral agent", and the more the value is away from zero, the larger the helical twisting power. The lateral axis represents the "light irradiation amount ($mJ/cm^2$)".

First, the relationship between the chiral agent A and the chiral agent B in the composition layer before the irradiation with light corresponds to a time point in which the light irradiation amount is 0, and in a case where the absolute value of "helical twisting power ($\mu m^{-1}$) of chiral agent A×concentration (% by mass) of chiral agent A" is compared with the absolute value of "helical twisting power ($\mu m^{-1}$) of chiral agent B×concentration (% by mass) of chiral agent B", the "helical twisting power ($\mu m^{-1}$) of chiral agent B×concentration (% by mass) of chiral agent B" is larger. That is, a helical twisting power in the direction (+) of the helix induced by the chiral agent B is generated. Therefore, as shown in FIG. 6, the liquid crystal compound is twist-aligned along a thickness direction.

Figure 9:
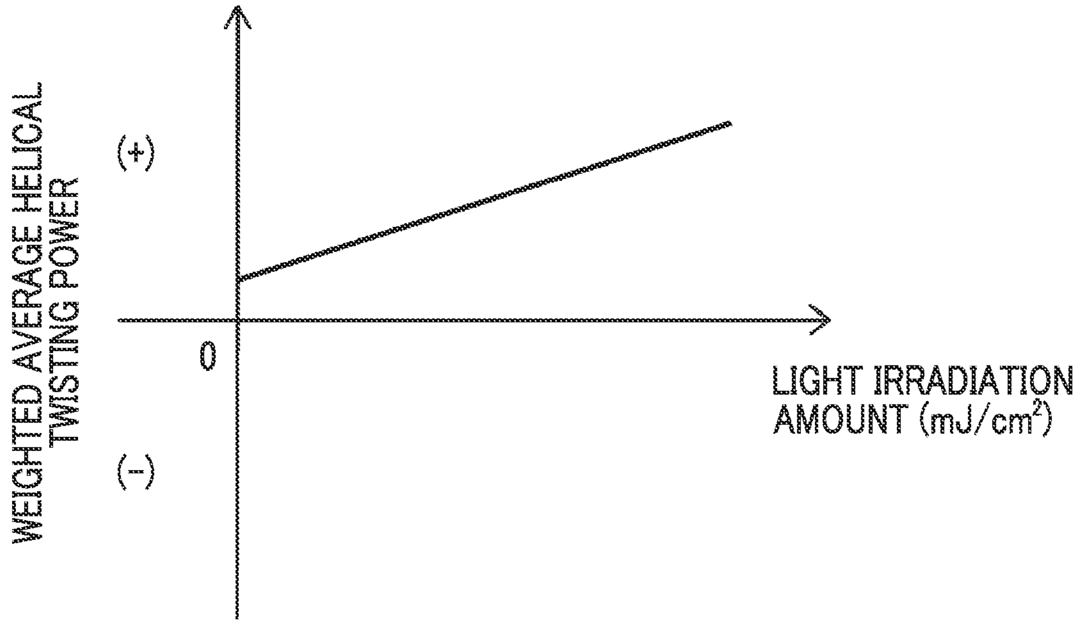
FIG. 9 is a schematic view of a graph plotting a relationship between a weighted average helical twisting power ($\mu m^{-1}$) and a light irradiation amount ($mJ/cm^2$) in a system in which the chiral agent A and the chiral agent B are used in combination.

In a case where light irradiation is carried out in the second region 20B in such a state and the helical twisting power of the chiral agent A decreases with the light irradiation amount as shown in FIG. 8, the weighted average helical twisting power of the chiral agent in the second region 20B is large and therefore the right-handed helical twisting power is strong, as shown in FIG. 9. That is, as for the helical twisting power that induces the helix of the liquid crystal compound, an increase in the irradiation amount leads to an increase in the helical twisting power in the direction (+) of the helix induced by the chiral agent B.

Figure 10:
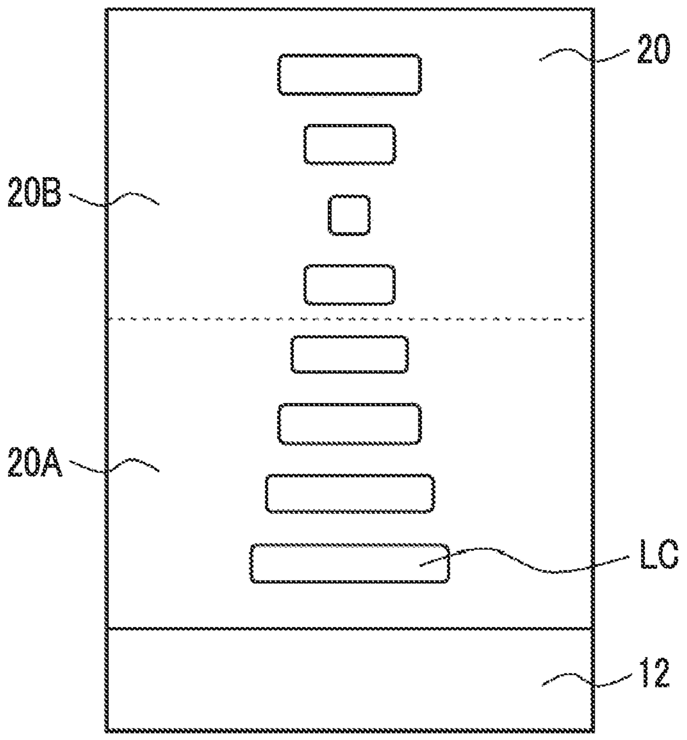
FIG. 10 is a cross-sectional view of the composition layer for explaining a step 4.

Therefore, in a case where the composition layer 20 after the step 3 in which such a change in the weighted average helical twisting power occurred is subjected to a heat treatment to promote the realignment of the liquid crystal compound, the twisted angle of the liquid crystal compound LC increases along a helical axis extending along the thickness direction of the composition layer 20 in the second region 20B, as shown in FIG. 10.

On the other hand, as described above, the polymerization of the liquid crystal compound proceeds to fix the alignment state of the liquid crystal compound during the step 3 in the first region 20A of the composition layer 20, so that the realignment of the liquid crystal compound does not proceed.

As described above, carrying out the step 4 leads to the formation of a plurality of regions having different alignment states of the liquid crystal compound along the thickness direction of the composition layer.

The degree of twist of the liquid crystal compound LC can be appropriately adjusted depending on the type of chiral agent A used, the exposure amount in the step 3, and the like, and therefore a predetermined twisted angle can be achieved.

In the above description, the aspect in which a chiral agent whose helical twisting power decreases upon irradiation with light is used as the chiral agent A has been described, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound is twist-aligned in the turning direction induced by the chiral agent A.

In addition, in the above description, the aspect in which the chiral agent A and the chiral agent B are used in combination has been described, but the present invention is not limited to this aspect. For example, it may be an aspect in which two chiral agents A are used. Specifically, it may be an aspect in which a chiral agent A1 that induces left-handed turning and a chiral agent A2 that induces right-handed turning are used in combination. The chiral agent A1 and the chiral agent A2 may be each independently a chiral agent whose helical twisting power increases or a chiral agent whose helical twisting power decreases. For example, a chiral agent that induces left-handed turning and whose helical twisting power increases upon irradiation with light and a chiral agent that induces right-handed turning and whose helical twisting power decreases upon irradiation with light may be used in combination.

With regard to the heat treatment conditions, the optimum conditions are selected according to the liquid crystal compound used.

Above all, the heating temperature is preferably a temperature for heating from the state of the step 3, often 35° C. to 250° C., more often 50° C. to 150° C., still more often higher than 50° C. and 150° C. or lower, and particularly often 60° C. to 130° C.

The heating time is often 0.01 to 60 minutes and more often 0.03 to 5 minutes.

In addition, the absolute value of the weighted average helical twisting power of the chiral agent in the composition layer after the irradiation with light is not particularly limited, and the absolute value of the difference between the weighted average helical twisting power of the chiral agent in the composition layer after the irradiation with light and the weighted average helical twisting power of the chiral agent in the composition layer before the irradiation with light is preferably 0.05 $\mu m^{-1}$ or more, more preferably 0.05 to 10.0 $\mu m^{-1}$, and still more preferably 0.1 to 10.0 $\mu m^{-1}$.

(Step 5)

The step 5 is a step of subjecting the composition layer to a curing treatment to fix an alignment state of the liquid crystal compound to form a first optically anisotropic layer and a second optically anisotropic layer, after the step 4. By carrying out this step, the alignment state of the liquid crystal compound in the composition layer is fixed, and as a result, a predetermined optically anisotropic layer is formed.

The method of the curing treatment is not particularly limited, and examples thereof include a photocuring treatment and a thermal curing treatment. Above all, a light irradiation treatment is preferable, and an ultraviolet irradiation treatment is more preferable.

A light source such as an ultraviolet lamp is used for the ultraviolet irradiation.

The irradiation amount of light (for example, ultraviolet rays) is not particularly limited, and is generally preferably about 100 to 800 $mJ/cm^2$.

<Other Members>

The polarizing plate according to the embodiment of the present invention may have members other than the above-mentioned polarizer and optically anisotropic layer.

(Support)

The polarizing plate may have a support. As described above, the support is included as an object to be coated onto which the composition for forming a polarizer is applied, and may be included in the polarizing plate as it is.

The support is preferably a transparent support. The transparent support is intended to refer to a support having a visible light transmittance of 60% or more, which preferably has a visible light transmittance of 80% or more and more preferably 90% or more.

The support may be an elongated support (long support). The length of the elongated support in a longitudinal direction is not particularly limited, and a support having a length of 10 m or more is preferable. From the viewpoint of productivity, a support having a length of 100 m or more is preferable. The length in a longitudinal direction is not particularly limited, and is often 10,000 m or less.

The width of the elongated support is not particularly limited and is often 150 to 3,000 mm and preferably 300 to 2,000 mm.

The support may contain various additives (for example, an optical anisotropy adjuster, a wavelength dispersion adjuster, a fine particle, a plasticizer, an ultraviolet inhibitor, a deterioration inhibitor, and a release agent).

In order to improve the adhesion of the support to the layer provided thereon, the surface of the support may be subjected to a surface treatment (for example, a glow discharge treatment, a corona discharge treatment, an ultraviolet (UV) treatment, or a flame treatment).

In addition, an adhesive layer (undercoat layer) may be provided on the support.

The support may be a so-called temporary support.

In addition, the surface of the support may be directly subjected to a rubbing treatment. That is, a support that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the support in a certain direction with paper, gauze, felt, rubber, nylon fiber, polyester fiber, or the like can be used.

In addition, as described above, the support may have an alignment layer on a surface thereof.

(Surface Protective Layer)

The polarizing plate may have a surface protective layer. In a case where the polarizing plate is applied to an image display apparatus, the surface protective layer is preferably disposed on the most visible side.

The material constituting the surface protective layer is not particularly limited and may be an inorganic substance or an organic substance. Examples of the surface protective layer include a glass substrate and a polymer film such as polyimide or cellulose acylate.

The surface layer of the surface protective layer may include one layer or a plurality of layers selected from a surface cured layer (hard coat layer), a low reflective layer that suppresses the surface reflection that occurs at the air interface, and the like.

In addition, the composition for forming a polarizer may be directly applied onto a surface of the surface protective layer opposite to the visible side to form the polarizer.

The thickness of the surface protective layer is not particularly limited and is preferably 800 μm or less and more preferably 100 μm or less from the viewpoint of reducing the thickness. The lower limit of the thickness of the surface protective layer is not particularly limited, and is preferably 0.1 μm or more.

For example, a bendable glass substrate having a thickness of 100 μm or less makes it possible to take advantage of the flexible properties of an organic EL display device, which is thus preferable.

Further, for a glass substrate having a thickness of 100 μm or less, from the viewpoint of impact resistance, it is also preferable to bond a resin film of a (meth)acrylic resin, a polyester-based resin such as polyethylene terephthalate (PET), a cellulose-based resin such as triacetyl cellulose (TAC), or a cycloolefin-based resin such as a norbornene-based resin, as a protective film, to the glass substrate with an adhesive or the like. In particular, from the viewpoint of flexibility, it is preferable to bond polyethylene terephthalate (PET) to the glass substrate, and from the viewpoint of visibility, it is preferable to bond polyethylene terephthalate (PET) having an in-plane retardation of 3,000 to 10,000 nm to the glass substrate.

<Organic Electroluminescent (EL) Display Device>

The organic EL display device according to the embodiment of the present invention has the above-mentioned polarizing plate. The polarizing plate according to the embodiment of the present invention can be suitably applied as a circularly polarizing plate.

Usually, the polarizing plate is provided on an organic EL display panel (organic EL display element) of the organic EL display device. In the polarizing plate, the polarizer is disposed on the viewing side.

The organic EL display panel is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

EXAMPLES

Hereinafter, features of the present invention will be described in more detail with reference to Examples and Comparative Examples. The materials, amounts used, proportions, treatment details, treatment procedure, and the like shown in the following Examples can be appropriately changed without departing from the spirit and scope of the present invention. Accordingly, the scope of the present invention should not be construed as being limited by the specific examples given below.

Example 1

(Preparation of Transparent Support)

The following composition was put into a mixing tank and stirred to prepare a cellulose acetate solution to be used as a core layer cellulose acylate dope.

| Core layer cellulose acylate dope | |
|---|---|
| Cellulose acetate having an acetyl substitution degree of 2.88 | 100 parts by mass |
| Polyester compound B described in Examples of JP2015-227955A | 12 parts by mass |
| Compound F given below | 2 parts by mass |
| Methylene chloride (first solvent) | 430 parts by mass |
| Methanol (second solvent) | 64 parts by mass |

Compound F

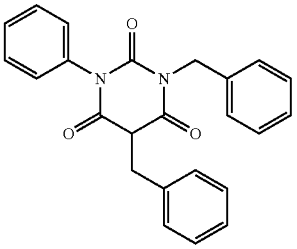 [SMILES: O=C1C(Cc2ccccc2)C(=O)N(c2ccccc2)C(=O)N1Cc1ccccc1]

10 parts by mass of the following matte agent solution were added to 90 parts by mass of the core layer cellulose acylate dope to prepare a cellulose acetate solution to be used as an outer layer cellulose acylate dope.

| Matte agent solution | |
|---|---|
| Silica particles having an average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope given above | 1 part by mass |

After filtering the core layer cellulose acylate dope and the outer layer cellulose acylate dope through a filter paper having an average pore size of 34 μm and a sintered metal filter having an average pore size of 10 μm, the core layer cellulose acylate dope and the outer layer cellulose acylate dope of both sides thereof were simultaneously cast in three layers on a drum at 20° C. from a casting port (band casting machine).

Next, the film on the drum was peeled off in a state where the solvent content in the film was about 20% by mass, both ends of the film in a width direction were fixed with tenter clips, and the film was dried while being stretched in a transverse direction at a stretching ratio of 1.1 times.

Then, the obtained film was transported between rolls of a heat treatment apparatus to be further dried to prepare a transparent support having a thickness of 40 μm, which was used as a cellulose acylate film A1.

(Formation of Photo-Alignment Film B1)

A composition for forming a photo-alignment film, which will be described later, was continuously applied onto the cellulose acylate film A1 with a wire bar. The support on which the coating film was formed was dried with hot air at 140° C. for 120 seconds, and then the coating film was irradiated with polarized ultraviolet rays (10 mJ/$cm^2$, using an ultra-high pressure mercury lamp) to form a photo-alignment film to obtain a triacetyl cellulose (TAC) film with a photo-alignment film. The film thickness of the photo-alignment film was 0.25 μm.

| Composition for forming photo-alignment film | |
|---|---|
| Polymer PA-1 given below | 100.00 parts by mass |
| Acid generator PAG-1 given below | 8.25 parts by mass |
| Stabilizer DIPEA given below | 0.6 parts by mass |
| Xylene | 1126.60 parts by mass |
| Methyl isobutyl ketone | 125.18 parts by mass |

Polymer PA-1 (In the formulae, the numberical value described in each repeating unit represents the content (% by mass) of each repeating unit with respect to all the repeating units).

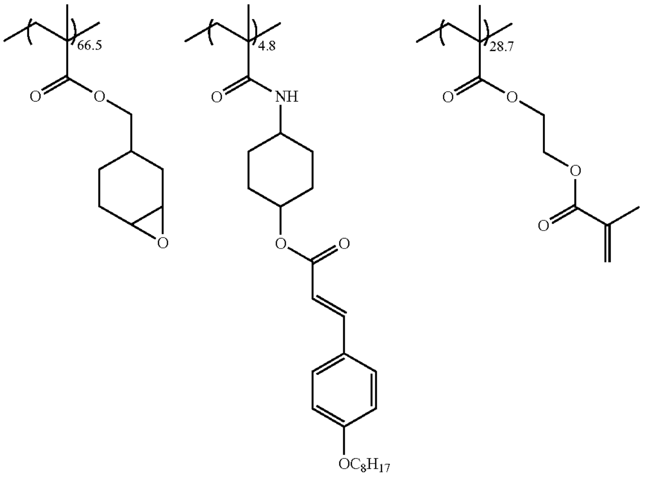

Acid generator PAG-1

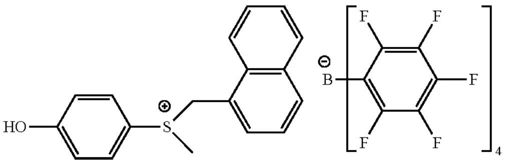

Stabilizer DIPEA

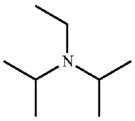

A composition for forming a polarizer having the following composition was continuously applied onto the obtained photo-alignment film with a wire bar to form a coating film.

Next, the coating film was heated at 140° C. for 15 seconds, and the coating film was cooled to room temperature (23° C.).

Next, the coating film was heated at 75° C. for 60 seconds and cooled again to room temperature.

Then, a polarizer (thickness: 1.8 μm) was prepared on the photo-alignment film by irradiation with a light emitting diode (LED) lamp (central wavelength: 365 nm) for 2 seconds under an irradiation condition of an illuminance of 200 mW/$cm^2$. In a case where the transmittance of the polarizer in a wavelength range of 280 to 780 nm was measured with a spectrophotometer, the average visible light transmittance was 42%. The absorption axis of the polarizer was orthogonal to the width direction of the cellulose acylate film A1.

| Composition of composition for forming polarizer | |
|---|---|
| First dichroic substance Dye-C1 given above | 0.65 parts by mass |
| Second dichroic substance Dye-M1 given above | 0.15 parts by mass |
| Third dichloric substance Dye-Y1 given above | 0.52 parts by mass |
| Liquid crystal compound (L-1) given below | 2.50 parts by mass |
| Rod-like liquid crystal compound (L-2) given below | 1.50 parts by mass |
| Polymerization initiator IRGACURE OXE-02 (manufactured by BASF SE) | 0.17 parts by mass |
| Surfactant (F-1) given below | 0.01 parts by mass |
| Cyclopentanone | 92.14 parts by mass |
| Benzyl alcohol | 2.36 parts by mass |

Dichroic substance Dye-C1

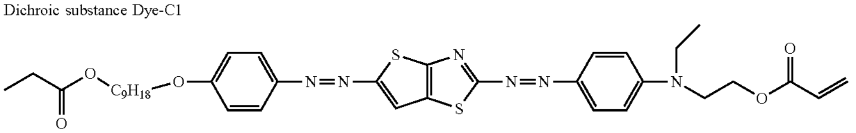

Dichroic substance Dye-M1

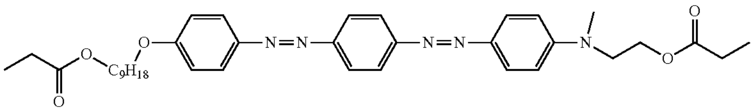

Dichroic substance Dye-Y1

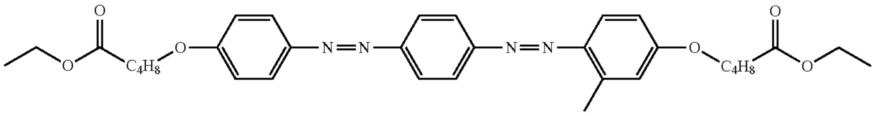

Liquid crystal compound (L-1) (In the formulae, the numerical values "59", "15", "26") described in each repeating unit represents the content (% by mass) of each repeating unit with respect to all the repeating unites).

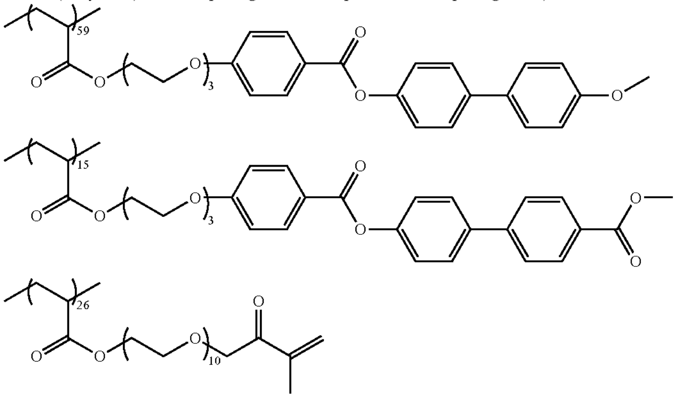

Rod-like liquid crystal compound (L-2)

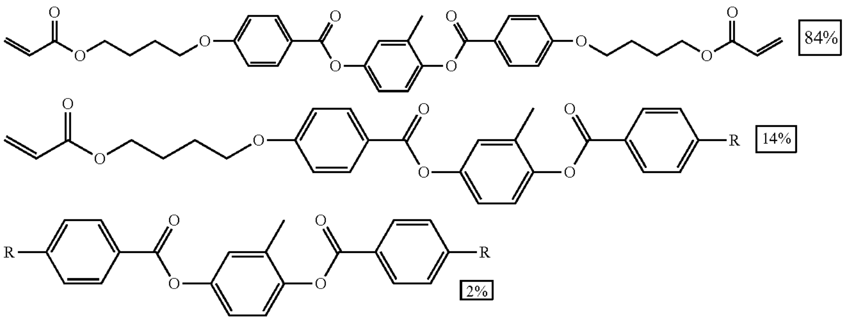

-continued

| Composition of composition for forming polarizer |
| --- |
| R: 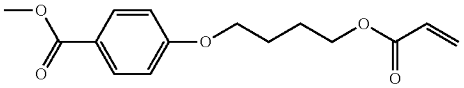 |
| Surfactant (F-1) (In the formulae, the numerical value described in each repeating unit represents the content (% by mass) of each repeating unit with respect to all the repeating units). |
| 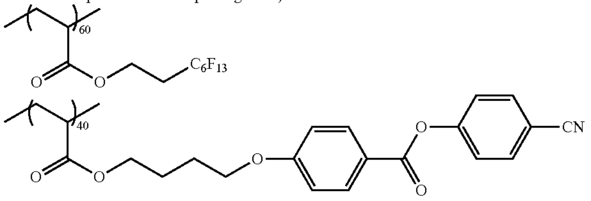 |

(Formation of Optically Anisotropic Layer)

A composition for forming an optically anisotropic layer containing a rod-like liquid crystal compound having the following composition was applied onto the prepared polarizer, and the obtained composition layer was heated at 60° C. for 100 seconds. The absolute value of the weighted average helical twisting power of the chiral agent in the composition layer was 0.03 $\mu m^{-1}$.

After that, the composition layer was irradiated with light of a 365 nm LED lamp (manufactured by AcroEdge Co., Ltd.) at an irradiation amount of 52 $mJ/cm^2$ at 40° C. under air (oxygen concentration: about 20% by volume) to fix the alignment state of the liquid crystal compound in a region of about half of the composition layer on the polarizer side.

Further, the obtained composition layer was heated at 60° C. for 30 seconds

After that, the composition layer was irradiated with light (irradiation amount: 500 $mJ/cm^2$) of a metal halide lamp (manufactured by Eye Graphics Co., Ltd.) at 55° C. under a nitrogen atmosphere to fix the liquid crystal compound in a region of half of the coating film on the air side to form an optically anisotropic layer (thickness: 3.0 μm), thereby preparing a circularly polarizing plate 1.

The optically anisotropic layer was composed of two layers exhibiting different optical anisotropy, the polarizer side layer (first optically anisotropic layer) in the optically anisotropic layer was a layer formed by fixing a rod-like liquid crystal compound twist-aligned with a thickness direction as a helical axis, the molecular axis of the liquid crystal compound in the layer was horizontal to the surface of the optically anisotropic layer, And of this layer was 282 nm, and the direction of the in-plane slow axis was 0° on the polarizer side surface and −26.5° on the air side surface (twisted angle=26.5°).

In addition, the air side layer (second optically anisotropic layer) in the optically anisotropic layer was a layer formed by fixing a rod-like liquid crystal compound twist-aligned with a thickness direction as a helical axis, the molecular axis of the liquid crystal compound in the layer was horizontal to the surface of the optically anisotropic layer, And of this layer was 140 nm, and the direction of the in-plane slow axis was −26.5° on the polarizer side surface and −105.1° on the air side surface (twisted angle=78.6°).

The above angle is represented by a positive value in a counterclockwise direction with the absorption axis of the polarizer as a reference (0°) in a case where the optically anisotropic layer is observed from the polarizer side.

| Composition for forming optically anisotropic layer | |
| --- | --- |
| Rod-like liquid crystal compound (L-2) given above | 80 parts by mass |
| Rod-like liquid crystal compound (B) given below | 10 parts by mass |
| Polymerizable compound (C) given below | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (IRGACURE 819, manufactured by BASF SE) | 3 parts by mass |
| Left-handed twisting chiral agent (L1) given below | 0.59 parts by mass |
| Right-handed twisting chiral agent (R1) given below | 0.39 parts by mass |
| Polymer (A) given below | 0.08 parts by mass |
| Polymer (B) given below | 0.50 parts by mass |
| Methyl isobutyl ketone | 121 parts by mass |
| Ethyl propionate | 41 parts by mass |

Rod-like liquid crystal compound (B)

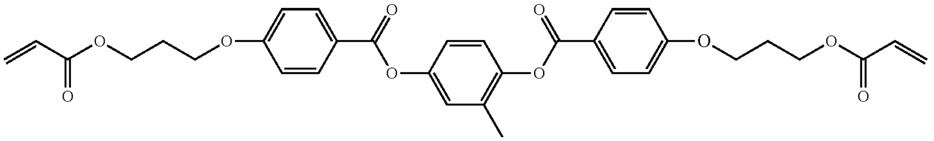 [SMILES: C=CC(=O)OCCCOc1ccc(C(=O)Oc2ccc(OC(=O)c3ccc(OCCCOC(=O)C=C)cc3)c(C)c2)cc1]

-continued

| Composition for forming optically anisotropic layer |
|---|

Polymerizable compound (C)

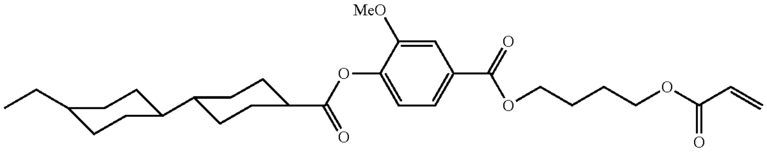 [SMILES: C=CC(=O)OCCCCOC(=O)c1ccc(OC(=O)C2CCC(C3CCC(CC)CC3)CC2)c(OC)c1]

Left-handed twisting chiral agent (L1)

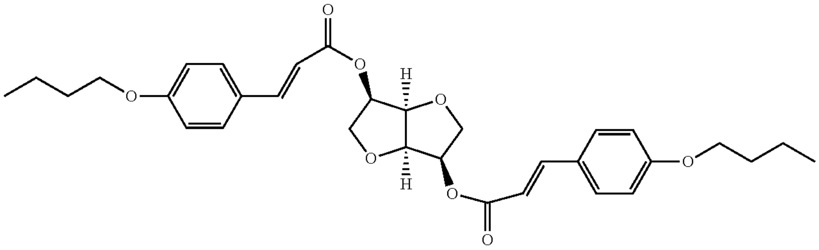 [SMILES: CCCCOc1ccc(/C=C/C(=O)O[C@@H]2CO[C@H]3[C@@H]2OC[C@H]3OC(=O)/C=C/c2ccc(OCCCC)cc2)cc1]

Right-handed twisting chiral agent (R1)

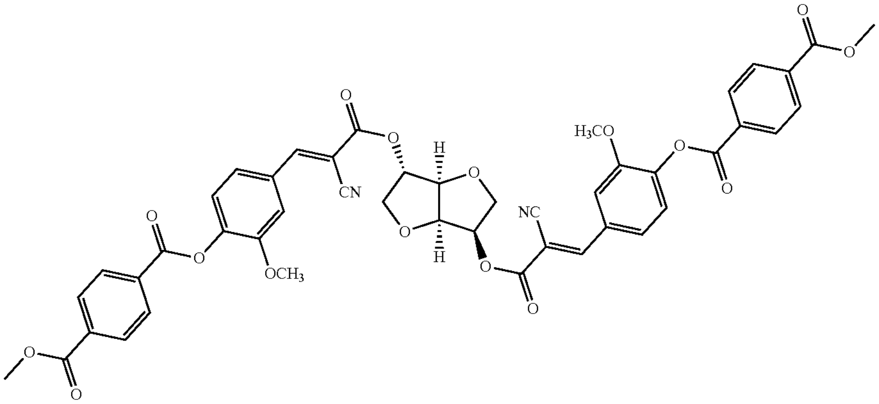

Polymer (A) (In the formulae, the numerical value described in each repeating unit represents the content (% by mass) of each repeating unit with respect to all the repeating units)

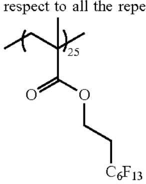

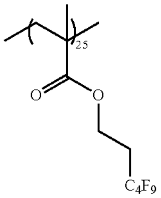

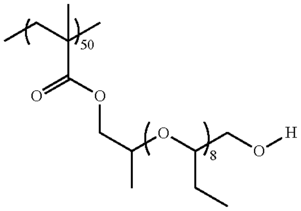

Polymer (B) (In the formulae, the numerical value described in each repeating unit represents the content (% by mass) of each repeating unit with respect to all the repeating units).

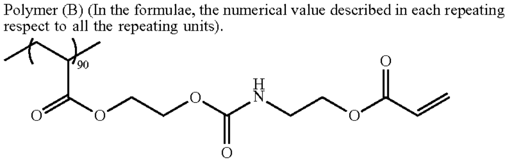

-continued

| Composition for forming optically anisotropic layer |
| --- |
| 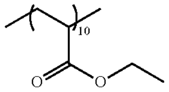 |

(Preparation of Pressure Sensitive Adhesive Layer)

Next, an acrylate-based polymer was prepared according to the following procedure.

Butyl acrylate (95 parts by mass) and acrylic acid (5 parts by mass) were polymerized by a solution polymerization method in a reaction container equipped with a cooling pipe, a nitrogen introduction pipe, a thermometer, and a stirrer to obtain an acrylate-based polymer (S1) having an average molecular weight of 2,000,000 and a molecular weight distribution (Mw/Mn) of 3.0.

Next, a composition for forming a pressure sensitive adhesive layer having the following composition was obtained using the obtained acrylate-based polymer (S1).

| Composition for forming pressure sensitive adhesive layer | |
| --- | --- |
| Acrylate-based polymer (S1) | 100 parts by mass |
| (A) Polyfunctional acrylate-based monomer given below | 11.1 parts by mass |
| (B) Photopolymerization initiator given below | 1.1 parts by mass |
| (C) Isocyanate-based crosslinking agent given below | 1.0 parts by mass |
| (D) Silane coupling agent given below | 0.2 parts by mass |

(A) Polyfunctional acrylate-based monomer: tris(acryloyloxyethyl)isocyanurate, molecular weight = 423, trifunctional type (trade name "ARONIX M-315", manufactured by Toagosei Co., Ltd.)

(B) Photopolymerization initiator: a mixture of benzophenone and 1-hydroxycyclohexyl phenyl ketone in a mass ratio of 1:1, "IRGACURE 500" manufactured by Ciba Specialty Chemicals, Inc.

(C) Isocyanate-based crosslinking agent: trimethylolpropane-modified tolylene diisocyanate ("CORONATE L" manufactured by Nippon Polyurethane Industry Co., Ltd.)

(D) Silane coupling agent: 3-glycidoxypropyltrimethoxysilane ("KBM-403" manufactured by Shin-Etsu Chemical Co., Ltd.)

This composition for forming a pressure sensitive adhesive layer was applied onto a separate film surface-treated with a silicone-based release agent using a die coater, and the obtained coating film was dried in an environment of 90° C. for 1 minute. Next, the obtained coating film was irradiated with ultraviolet rays (UV) under the following conditions to obtain a pressure sensitive adhesive layer. The thickness of the pressure sensitive adhesive layer was 15 μm.

—UV Irradiation Conditions—

Fusion's electrodeless lamp H bulb

Illuminance: 600 $mW/cm^2$, light amount: 150 $mJ/cm^2$

UV illuminance and light amount were measured using "UVPF-36" (manufactured by Eye Graphics Co., Ltd.).

The GALAXY S5 (manufactured by Samsung Electronics Co., Ltd.) equipped with an organic EL display panel was disassembled, a touch panel with a circularly polarizing plate was peeled off from the organic EL display device, and the circularly polarizing plate was further peeled off from the touch panel to isolate the organic EL display panel, the touch panel, and the circularly polarizing plate, respectively. Subsequently, the isolated touch panel was re-bonded to the organic EL display panel, and the resulting structure was bonded onto the touch panel through the pressure sensitive adhesive layer prepared above while preventing air from entering the optically anisotropic layer side of the circularly polarizing plate 1 prepared above. Further, the cellulose acylate film A1 of the circularly polarizing plate 1 was peeled off, and the support side of a low-reflection surface film CV-LC5 (manufactured by FUJIFILM Corporation) was bonded to the peeled surface using the pressure sensitive adhesive layer prepared above to prepare an organic EL display device.

Examples 2 to 4, and Comparative Example 4

Circularly polarizing plates 2 to 4 and circularly polarizing plate C4 were prepared to further prepare organic EL display devices in the same manner as in Example 1, except that the used amounts of the dichroic substances Dye-Y1, Dye-M1, Dye-C1, the liquid crystal compound (L-1), and the rod-like liquid crystal compound (L-2) in the composition for forming a polarizer were each changed to the added amounts by mass shown in Table 1.

Examples 5 and 6

Circularly polarizing plates 5 and 6 were prepared to further prepare organic EL display devices in the same manner as in Example 2, except that the rod-like liquid crystal compound (L-2) was changed to a rod-like liquid crystal compound (L-3) or a rod-like liquid crystal compound (L-4) as shown in Table 1.

The rod-like liquid crystal compound (L-3) shown in Table 1, which will be described later, has the following structure.

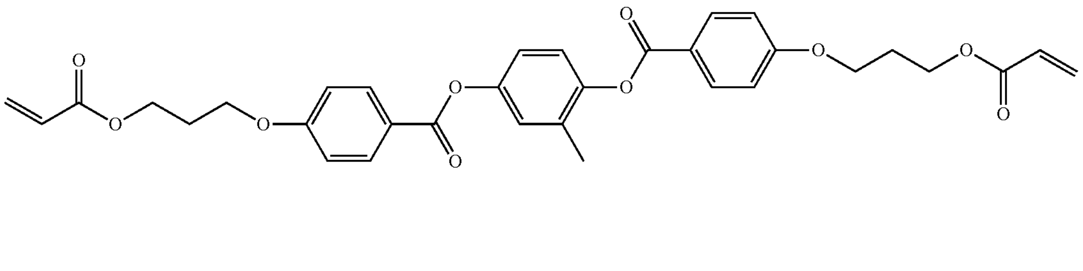 [SMILES: C=CC(=O)OCCCOc1ccc(C(=O)Oc2ccc(OC(=O)c3ccc(OCCCOC(=O)C=C)cc3)c(C)c2)cc1]

In addition, the rod-like liquid crystal compound (L-4) shown in Table 1, which will be described later, has the following structure.

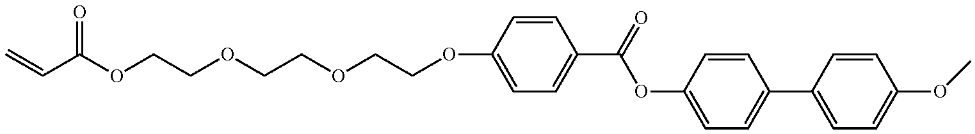 [SMILES: C=CC(=O)OCCOCCOCCOc1ccc(C(=O)Oc2ccc(-c3ccc(OC)cc3)cc2)cc1]

Examples 7 and 8

A circularly polarizing plate 7 was prepared in the same manner as in Example 1, except that the support onto which the composition for forming a polarizer was applied was changed to the low-reflection surface film CV-LC5 (manufactured by Fujifilm Corporation).

In addition, a circularly polarizing plate 8 was prepared in the same manner as in Example 1, except that the support onto which the composition for forming a polarizer was applied was changed to glass with an AR film (AR glass 1) in which an AR film (manufactured by Dexerials Corporation, AR100; 91 μm) and a glass substrate having a thickness of 50 μm (manufactured by SCHOTT AG, D263) were bonded together using the pressure sensitive adhesive layer prepared above.

The GALAXY S5 (manufactured by Samsung Electronics Co., Ltd.) equipped with an organic EL display panel was disassembled, a touch panel with a circularly polarizing plate was peeled off from the organic EL display device, and the circularly polarizing plate was further peeled off from the touch panel to isolate the organic EL display panel, the touch panel, and the circularly polarizing plate, respectively. Subsequently, the isolated touch panel was re-bonded to the organic EL display panel, and the resulting structure was bonded onto the touch panel through the pressure sensitive adhesive layer prepared above while preventing air from entering the optically anisotropic layer side of each of the circularly polarizing plates 7 and 8 prepared above, whereby an organic EL display device was prepared.

Examples 9 to 11

Circularly polarizing plates 9 to 11 were prepared in the same manner as in Example 1, except that the support onto which the composition for forming a polarizer was applied was changed to a commercially available COSMOSHINE SRF (thickness: 80 μm), a commercially available cycloolefin film, or ZEONOR ZB12 (thickness: 50 μm) (manufactured by Zeon Corporation).

The GALAXY S5 (manufactured by Samsung Electronics Co., Ltd.) equipped with an organic EL display panel was disassembled, a touch panel with a circularly polarizing plate was peeled off from the organic EL display device, and the circularly polarizing plate was further peeled off from the touch panel to isolate the organic EL display panel, the touch panel, and the circularly polarizing plate, respectively. Subsequently, the isolated touch panel was re-bonded to the organic EL display panel, and the resulting structure was bonded onto the touch panel through the pressure sensitive adhesive layer prepared above while preventing air from entering the optically anisotropic layer side of each of the circularly polarizing plates 9 to 11 prepared above. Further, the resulting structure was bonded to the support side of the low-reflection surface film CV-LC5 (manufactured by FUJIFILM Corporation) or the glass side of the AR glass 1, as shown in Table 1, using the pressure sensitive adhesive layer prepared above, whereby an organic EL display device was prepared.

Comparative Example 1

(Preparation of Cellulose Acylate Film A2)

The following components for a cellulose acylate dope was put into a mixing tank and stirred to obtain a composition which was then heated at 90° C. for 10 minutes.

Then, the obtained composition was filtered through a filter paper having an average pore diameter of 34 μm and a sintered metal filter having an average pore diameter of 10 μm to prepare a dope. The concentration of solid contents of the dope is 23.5% by mass, the amount of the plasticizer added is a proportion relative to cellulose acylate, and the solvent of the dope is methylene chloride/methanol/butanol=81/18/1 (in terms of a mass ratio).

| Cellulose acylate dope | |
|---|---|
| Cellulose acylate (acetyl substitution degree: 2.86, viscosity average polymerization degree: 310) | 100 parts by mass |
| Sugar ester compound 1 (represented by Chemical Formula (S4)) | 6.0 parts by mass |
| Sugar ester compound 2 (represented by Chemical Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/methanol/butanol) | |

-continued

Cellulose acylate dope

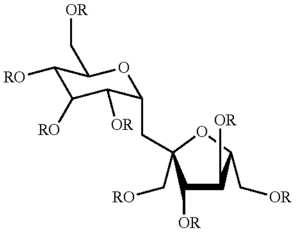

(84)

(R = benzoyl or H Average substitution degree: 5.7)

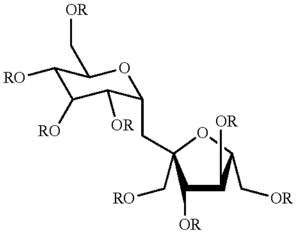

(85)

(R = acetyl/isobutyryl = 2/6)

The dope prepared above was cast using a drum film forming machine. The dope was cast from a die such that the dope was in contact with a metal support cooled to 0° C., and then the obtained web (film) was stripped off. The drum was made of SUS.

The web (film) obtained by casting was peeled off from the drum. Then, at 30° C. to 40° C. at the time of transporting the film, using a tenter device that clips both ends of the web with clips to transport the web, the web was dried in the tenter device for 20 minutes. Subsequently, the obtained web was post-dried by zone heating while being rolled and transported. The obtained web was knurled and then wound up. The obtained cellulose acylate film had a film thickness of 40 μm, an in-plane retardation Re(550) of 1 nm at a wavelength of 550 nm, and a thickness direction retardation Rth(550) of 26 nm at a wavelength of 550 nm.

(Formation of Optically Anisotropic Layer)

The above prepared cellulose acylate film A2 was continuously subjected to a rubbing treatment. At this time, the longitudinal direction and the transport direction of the elongated film were parallel to each other, and the angle formed by the longitudinal direction (transport direction) of the film and the rotation axis of the rubbing roller was set to 90°.

An optically anisotropic layer was formed on the rubbing-treated cellulose acylate film A2 to prepare an optically anisotropic film in the same manner as in Example 1, except that the rubbing-treated cellulose acylate film A2 was used as a substrate, and the above-mentioned composition for forming an optically anisotropic layer was applied using a geeser coating machine.

Next, using the pressure sensitive adhesive layer prepared above, the cellulose acylate film A2 side of the optically anisotropic film was bonded to the polarizer prepared in Example 1 to prepare a circularly polarizing plate C1. In the obtained circularly polarizing plate C1, the polarizer and the optically anisotropic layer were bonded to each other through a pressure sensitive adhesive layer.

The GALAXY S5 (manufactured by Samsung Electronics Co., Ltd.) equipped with an organic EL display panel was disassembled, a touch panel with a circularly polarizing plate was peeled off from the organic EL display device, and the circularly polarizing plate was further peeled off from the touch panel to isolate the organic EL display panel, the touch panel, and the circularly polarizing plate, respectively. Subsequently, the isolated touch panel was re-bonded to the organic EL display panel, and the resulting structure was bonded onto the touch panel through the pressure sensitive adhesive layer prepared above while preventing air from entering the optically anisotropic layer side of the circularly polarizing plate C1 prepared above. Further, the cellulose acylate film A1 of the circularly polarizing plate C1 was peeled off, and the support side of a low-reflection surface film CV-LC5 (manufactured by FUJIFILM Corporation) was bonded to the peeled surface using the pressure sensitive adhesive layer prepared above to prepare an organic EL display device.

Comparative Example 2

The following UV adhesive S1 was prepared.

| UV adhesive S1 | |
|---|---|
| CEL2021P (manufactured by Daicel Corporation) | 70 parts by mass |
| 1,4-Butanediol diglycidyl ether | 20 parts by mass |
| 2-Ethylhexyl glycidyl ether | 10 parts by mass |
| CPI-100P | 2.25 parts by mass |

-continued

| UV adhesive S1 |
|---|

CEL2021P

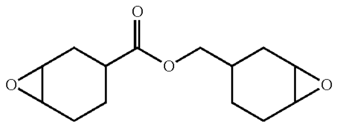 [SMILES: O=C(OCC1CCC2OC2C1)C1CCC2OC2C1]

CPI-100P

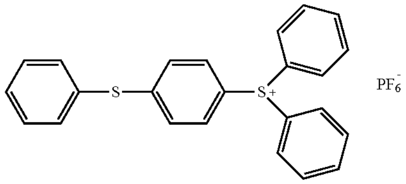

The cellulose acylate film A2 side of the optically anisotropic film prepared in Comparative Example 1 was bonded to the polarizer prepared in Example 1 using the above-mentioned UV adhesive S1, and the obtained laminate was exposed to light at an illuminance of 1,000 $mJ/cm^2$ and cured to prepare a circularly polarizing plate C2. In the obtained circularly polarizing plate, the polarizer and the optically anisotropic layer were bonded to each other through a UV adhesive.

Next, an organic EL display device was prepared in the same manner as in Comparative Example 1, except that the circularly polarizing plate C2 was used instead of the circularly polarizing plate C1.

Comparative Example 3

An alignment film coating liquid having the following composition was continuously applied onto the polarizer prepared in Example 1 with a wire bar. Then, the obtained coating film was dried with hot air at 80° C. for 5 minutes to obtain a laminate on which an alignment film consisting of polyvinyl alcohol (PVA) having a thickness of 0.5 μm was formed. The obtained laminate has a cellulose acylate film A1 (transparent support), a photo-alignment film, a polarizer, and an alignment film consisting of PVA adjacent to each other in this order.

The surface of the prepared laminate on the alignment film side was continuously subjected to a rubbing treatment. At this time, the longitudinal direction and the transport direction of the elongated film were parallel to each other, and the angle formed by the longitudinal direction (transport direction) of the film and the rotation axis of the rubbing roller was set to 90°.

| Alignment film coating liquid | |
|---|---|
| Modified polyvinyl alcohol given below | 3.80 parts by mass |
| Initiator IRGACURE 2959 | 0.20 parts by mass |
| Water | 70 parts by mass |
| Methanol | 30 parts by mass |

Modified polyvinyl alcohol

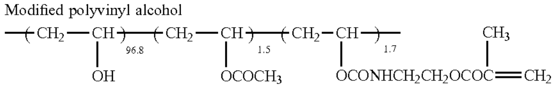

An optically anisotropic layer was formed on the rubbing-treated laminate to prepare a circularly polarizing plate C3 in the same manner as in Example 1, except that the rubbing-treated laminate was used as a substrate, and the above-mentioned composition for forming an optically anisotropic layer was applied using a geeser coating machine.

Next, an organic EL display device was prepared in the same manner as in Comparative Example 1, except that the circularly polarizing plate C3 was used instead of the circularly polarizing plate C1.

Comparative Example 5

A circularly polarizing plate C5 consisting of a cellulose acylate film, an alignment film, an optically anisotropic layer, and a polarizer layer was prepared by the method described in Example 17 of JP5753922B.

The GALAXY S5 (manufactured by Samsung Electronics Co., Ltd.) equipped with an organic EL display panel was disassembled, a touch panel with a circularly polarizing plate was peeled off from the organic EL display device, and the circularly polarizing plate was further peeled off from the touch panel to isolate the organic EL display panel, the touch panel, and the circularly polarizing plate, respectively. Subsequently, the isolated touch panel was re-bonded to the organic EL display panel, and the resulting structure was bonded onto the touch panel through the pressure sensitive adhesive layer prepared above while preventing air from entering the support side of the circularly polarizing plate C5 prepared above. Further, using the pressure sensitive adhesive layer prepared above, the support side of the low-reflection surface film CV-LC5 (manufactured by FUJIFILM Corporation) was bonded to the polarizer surface to prepare an organic EL display device.

The circularly polarizing plates obtained in Examples 1 to 11 were analyzed for components in a depth direction by TOF-SIMS. As a result, as shown in FIG. 2, the profile (line) indicating the secondary ion intensity derived from the component contained in the polarizer and the profile (line) indicating the secondary ion intensity derived from the component contained in the optically anisotropic layer intersected at a predetermined depth position.

On the other hand, in Comparative Examples 1 to 4, no result was obtained in which the profile (line) indicating the secondary ion intensity derived from the component contained in the polarizer intersected with the profile (line) indicating the secondary ion intensity derived from the component contained in the optically anisotropic layer, which shown in FIG. 2.

<Evaluation of Durability>

The prepared organic EL display device was aged for 1,000 hours in an environment with a temperature of 95° C. and a relative humidity of less than 10%. After that, the display screen of the obtained organic EL display device was brought into a black display state, and the reflected light in a case where a fluorescent lamp was projected from the front was observed. The display performance was evaluated based on the following standards. The evaluation results are shown in Table 1 which will be described later.

<Evaluation Standards>

A: It is black, no color-tinting is visible at all, and the reflectivity is low

B: Coloring is slightly visible, but the reflectivity is low

C: Coloring is slightly visible, and the reflectivity is high

D: Coloring is clearly visible and the reflectivity is high

In Table 1, the column of "Concentration of dichroic substance" represents a content (% by mass) of a dichroic substance with respect to a total mass of a polarizer.

The column of "Bonding method" in Table 1 represents a method of bonding a polarizer and an optically anisotropic layer, and the "Lamination coating" represents a method of forming an optically anisotropic layer by applying a composition for forming an optically anisotropic layer onto a polarizer so that the polarizer and the optically anisotropic layer are disposed adjacent to each other. The "PSA" represents a method of bonding a polarizer and an optically anisotropic layer through a pressure sensitive adhesive layer. The "UV adhesion" represents a method of bonding a polarizer and an optically anisotropic layer through a UV adhesive. The "PVA alignment film" represents a method of forming an optically anisotropic layer using a PVA alignment film. In this embodiment, the PVA alignment film is disposed between a polarizer and an optically anisotropic layer.

The column of "Axis deviation (°)" in Table 1 represents an angle formed by an absorption axis of a polarizer and an in-plane slow axis on a surface of an optically anisotropic layer on a polarizer side (in other words, an in-plane slow axis on a surface of a first optically anisotropic layer on the polarizer side).

The "Δ log P" in Table 1 represents an absolute value of a difference between a log P of a liquid crystal compound and a log P of a dichroic substance. The "Δ log P" indicates the smallest absolute value of a difference between a log P of each of three dichroic substances (Dye-Y1, Dye-M1, and Dye-C1) and a log P of a second liquid crystal compound.

TABLE 1

| | | | Polarizer | | | | | | |
|---|---|---|---|---|---|---|---|---|---|
| | | | | % by mass | | | | | |
| | Surface protective layer | Support | Concentration of dichroic substance | Liquid crystal compound L-1 | Rod-like liquid crystal compound L-2 | Dye-Y1 | Dye-M1 | Dye-C1 | Bonding method |
| Example 1 | CV-LC5 | Film AI | 24% | 2.5 | 1.5 | 0.5 | 0.2 | 0.7 | Lamination coating |
| Example 2 | CV-LC5 | Film A1 | 27% | 2.4 | 1.4 | 0.6 | 0.2 | 0.7 | Lamination coating |
| Example 3 | CV-LC5 | Film Al | 30% | 2.3 | 1.4 | 0.7 | 0.2 | 0.8 | Lamination coating |
| Example 4 | CV-LC5 | Film A1 | 18% | 2.7 | 1.6 | 0.4 | 0.1 | 0.5 | Lamination coating |
| Example 5 | CV-LC5 | Film A1 | 27% | 2.4 | 1.4 | 0.6 | 0.2 | 0.7 | Lamination coating |
| Example 6 | CV-LC5 | Film A1 | 27% | 2.4 | 1.4 | 0.6 | 0.2 | 0.7 | Lamination coating |
| Example 7 | — | CV-LC5 | 24% | 2.5 | 1.5 | 0.5 | 0.2 | 0.7 | Lamination coating |
| Example 8 | — | AR glass 1 | 24% | 2.5 | 1.5 | 0.5 | 0.2 | 0.7 | Lamination coating |
| Example 9 | CV-LC5 | COSMOSHINE SRF | 24% | 2.5 | 1.5 | 0.5 | 0.2 | 0.7 | Lamination coating |
| Example 10 | AR glass 1 | COSMOSHINE SRF | 24% | 2.5 | 1.5 | 0.5 | 0.2 | 0.7 | Lamination coating |
| Example 11 | AR glass 1 | ZEONOR ZB12 | 24% | 2.5 | 1.5 | 0.5 | 0.2 | 0.7 | Lamination coating |
| Comparative Example 1 | CV-LC5 | Film A1 | 24% | 2.5 | 1.5 | 0.5 | 0.2 | 0.7 | PSA |
| Comparative Example 2 | CV-LC5 | Film A1 | 24% | 2.5 | 1.5 | 0.5 | 0.2 | 0.7 | UV adhesion |

TABLE 1-continued

| | Axis deviation (°) | Optically anisotropic layer: Liquid crystal compound Type | logP | First optically anisotropic layer: Twisted angle (°) | ⊿nd (nm) | Second optically anisotropic layer: Twisted angle (°) | ⊿nd (nm) | ΔlogP | Imax/Isurl | Evaluation |
|---|---|---|---|---|---|---|---|---|---|---|
| Example 1 | 0.00 | Rod-like liquid crystal compound L-2 | 7.2 | 26.5 | 282 | 78.6 | 140.0 | 2.5 | 13.8 | B |
| Example 2 | 0.00 | Rod-like liquid crystal compound L-2 | 7.2 | 26.5 | 282 | 78.6 | 140.0 | 2.5 | 15.5 | B |
| Example 3 | 0.00 | Rod-like liquid crystal compound L-2 | 7.2 | 26.5 | 282 | 78.6 | 140.0 | 2.5 | 17.2 | B |
| Example 4 | 0.00 | Rod-like liquid crystal compound L-2 | 7.2 | 26.5 | 282 | 78.6 | 140.0 | 2.5 | 10.3 | B |
| Example 5 | 0.00 | Rod-like liquid crystal compound L-3 | 6.3 | 26.5 | 282 | 78.6 | 140.0 | 3.5 | 15.5 | A |
| Example 6 | 0.00 | Rod-like liquid crystal compound L-4 | 4.7 | 26.5 | 282 | 78.6 | 140.0 | 5.0 | 15.5 | A |
| Example 7 | 0.00 | Rod-like liquid crystal compound L-2 | 7.2 | 26.5 | 282 | 78.6 | 140.0 | 2.5 | 13.8 | B |
| Example 8 | 0.00 | Rod-like liquid crystal compound L-2 | 7.2 | 26.5 | 282 | 78.6 | 140.0 | 2.5 | 13.8 | B |
| Example 9 | 0.00 | Rod-like liquid crystal compound L-2 | 7.2 | 26.5 | 282 | 78.6 | 140.0 | 2.5 | 13.8 | B |
| Example 10 | 0.00 | Rod-like liquid crystal compound L-2 | 7.2 | 26.5 | 282 | 78.6 | 140.0 | 2.5 | 13.8 | B |
| Example 11 | 0.00 | Rod-like liquid crystal compound L-2 | 7.2 | 26.5 | 282 | 78.6 | 140.0 | 2.5 | 13.8 | B |
| Comparative Example 1 | 0.00 | Rod-like liquid crystal compound L-2 | 7.2 | 26.5 | 282 | 78.6 | 140.0 | 2.5 | 13.8 | D |
| Comparative Example 2 | 0.00 | Rod-like liquid crystal compound L-2 | 7.2 | 26.5 | 282 | 78.6 | 140.0 | 2.5 | 13.8 | D |

TABLE 2

| | Polarizer Concentration of coloring agent | Bonding method | Axis deviation (°) | Optically anisotropic layer: Liquid crystal compound Type | logP | First optically anisotropic layer: Twisted angle (°) | ⊿nd (nm) | Second optically anisotropic layer: Twisted angle (°) | ⊿nd (nm) | ΔlogP | Imax/Isurl | Evaluation |
|---|---|---|---|---|---|---|---|---|---|---|---|---|
| Comparative Example 5 | 60% | Lamination coating | 0.00 | Rod-like liquid crystal compound L-2 | 7.2 | 26.5 | 282 | 78.6 | 140.0 | 0.3 | 1.1 | C |

As shown in Table 1, it was confirmed that a desired effect can be obtained by using the polarizing plate according to the embodiment of the present invention.

Above all, from Examples 5 and 6, it was confirmed that the effect was more excellent in a case where Δ log P was 3.0 or more.

EXPLANATION OF REFERENCES

10A, 10B: polarizing plate
12: polarizer
14, 140: optically anisotropic layer
16: first optically anisotropic layer
18: second optically anisotropic layer
20: composition layer
20A: first region
20B: second region

What is claimed is:

1. A polarizing plate comprising: a polarizer formed of a composition containing a first liquid crystal compound and a dichroic substance; and an optically anisotropic layer disposed adjacent to the polarizer and formed of a composition containing a second liquid crystal compound, wherein a content of the dichroic substance in the polarizer is 5% to 40% by mass with respect to a total mass of the polarizer; wherein the optically anisotropic layer has a plurality of layers formed by fixing a twist-aligned second liquid crystal compound with a thickness direction as a helical axis, and twisted angles of the second liquid crystal compound are different from each other in the plurality of layers.

2. The polarizing plate according to claim 1, wherein the content of the dichroic substance in the polarizer is 5% to 30% by mass with respect to the total mass of the polarizer.

3. The polarizing plate according to claim 2, wherein an angle formed by an absorption axis of the polarizer and an in-plane slow axis on a surface of the optically anisotropic layer on a side of the polarizer is within 1°.

4. The polarizing plate according to claim 2, wherein the optically anisotropic layer is a layer formed by fixing a twist-aligned second liquid crystal compound with a thickness direction as a helical axis.

5. The polarizing plate according to claim 2, wherein the optically anisotropic layer has a plurality of layers formed by fixing a twist-aligned second liquid crystal compound with a thickness direction as a helical axis, and twisted angles of the second liquid crystal compound are different from each other in the plurality of layers.

6. The polarizing plate according to claim 2, wherein the optically anisotropic layer has a plurality of layers formed by fixing a twist-aligned second liquid crystal compound with a thickness direction as a helical axis, and the plurality of layers each have a different ratio of the twisted angle of the second liquid crystal compound to a thickness of the layer.

7. The polarizing plate according to claim 2, wherein the optically anisotropic layer has a first optically anisotropic layer and a second optically anisotropic layer, the first optically anisotropic layer is disposed on a side of the polarizer, the first optically anisotropic layer and the second optically anisotropic layer are layers formed by fixing the twist-aligned second liquid crystal compound with a thickness direction as a helical axis, a twisted direction of the second liquid crystal compound in the first optically anisotropic layer and a twisted direction of the second liquid crystal compound in the second optically anisotropic layer are the same, the twisted angle of the second liquid crystal compound in the first optically anisotropic layer is 26.5°±10.0°, the twisted angle of the second liquid crystal compound in the second optically anisotropic layer is 78.6°±10.0°, an in-plane slow axis on a surface of the first optically anisotropic layer on a second optically anisotropic layer side is parallel to an in-plane slow axis on a surface of the second optically anisotropic layer on a first optically anisotropic layer side, and a value of a product $\Delta n1 \cdot d1$ of a refractive index anisotropy $\Delta n1$ of the first optically anisotropic layer measured at a wavelength of 550 nm and a thickness d1 of the first optically anisotropic layer, and a value of a product $\Delta n2 \cdot d2$ of a refractive index anisotropy $\Delta n2$ of the second optically anisotropic layer measured at a wavelength of 550 nm and a thickness d2 of the second optically anisotropic layer satisfy Expression (1) and Expression (2), respectively, $$252\ \text{nm} \le \Delta n1 \cdot d1 \le 312\ \text{nm} \qquad \text{Expression (1)}$$

$$110\ \text{nm} \le \Delta n2 \cdot d2 \le 170\ \text{nm}. \qquad \text{Expression (2)}$$

8. The polarizing plate according to claim 2, wherein, in a case of carrying out a component analysis in a depth direction of the polarizer by time-of-flight secondary ion mass spectrometry, a relationship between a maximum intensity Imax of a secondary ion intensity derived from the dichroic substance and an intensity Isur1 of the secondary ion intensity derived from the dichroic substance on a surface of the polarizer on a side opposite to the optically anisotropic layer satisfies Expression (3), $$2.0 \le I\text{max}/I\text{sur1}. \qquad \text{Expression (3)}$$

9. The polarizing plate according to claim 2, wherein an absolute value of a difference between a log P of the second liquid crystal compound and a log P of the dichroic substance is 3.0 or more.

10. An organic electroluminescent display device comprising the polarizing plate according to claim 2.

11. The polarizing plate according to claim 1, wherein an angle formed by an absorption axis of the polarizer and an in-plane slow axis on a surface of the optically anisotropic layer on a side of the polarizer is within 1°.

12. The polarizing plate according to claim 11, wherein the optically anisotropic layer is a layer formed by fixing a twist-aligned second liquid crystal compound with a thickness direction as a helical axis.

13. The polarizing plate according to claim 11, wherein the optically anisotropic layer has a plurality of layers formed by fixing a twist-aligned second liquid crystal compound with a thickness direction as a helical axis, and twisted angles of the second liquid crystal compound are different from each other in the plurality of layers.

14. The polarizing plate according to claim 1, wherein the optically anisotropic layer is a layer formed by fixing a twist-aligned second liquid crystal compound with a thickness direction as a helical axis.

15. The polarizing plate according to claim 1, wherein the optically anisotropic layer has a plurality of layers formed by fixing a twist-aligned second liquid crystal compound with a thickness direction as a helical axis, and the plurality of layers each have a different ratio of the twisted angle of the second liquid crystal compound to a thickness of the layer.

16. The polarizing plate according to claim 1, wherein the optically anisotropic layer has a first optically anisotropic layer and a second optically anisotropic layer, the first optically anisotropic layer is disposed on a side of the polarizer, the first optically anisotropic layer and the second optically anisotropic layer are layers formed by fixing the twist-aligned second liquid crystal compound with a thickness direction as a helical axis, a twisted direction of the second liquid crystal compound in the first optically anisotropic layer and a twisted direction of the second liquid crystal compound in the second optically anisotropic layer are the same, the twisted angle of the second liquid crystal compound in the first optically anisotropic layer is 26.5°±10.0°, the twisted angle of the second liquid crystal compound in the second optically anisotropic layer is 78.6°±10.0°, an in-plane slow axis on a surface of the first optically anisotropic layer on a second optically anisotropic layer side is parallel to an in-plane slow axis on a surface of the second optically anisotropic layer on a first optically anisotropic layer side, and a value of a product $\Delta n1 \cdot d1$ of a refractive index anisotropy $\Delta n1$ of the first optically anisotropic layer measured at a wavelength of 550 nm and a thickness d1 of the first optically anisotropic layer, and a value of a product $\Delta n2 \cdot d2$ of a refractive index anisotropy $\Delta n2$ of the second optically anisotropic layer measured at a wavelength of 550 nm and a thickness d2 of the second optically anisotropic layer satisfy Expression (1) and Expression (2), respectively, $$252\ \text{nm} \leq \Delta n1 \cdot d1 \leq 312\ \text{nm} \quad \text{Expression (1)}$$

$$110\ \text{nm} \leq \Delta n2 \cdot d2 \leq 170\ \text{nm}. \quad \text{Expression (2)}$$

17. The polarizing plate according to claim 1, wherein, in a case of carrying out a component analysis in a depth direction of the polarizer by time-of-flight secondary ion mass spectrometry, a relationship between a maximum intensity Imax of a secondary ion intensity derived from the dichroic substance and an intensity Isur1 of the secondary ion intensity derived from the dichroic substance on a surface of the polarizer on a side opposite to the optically anisotropic layer satisfies Expression (3), $$2.0 \leq I\text{max}/I\text{sur1}. \quad \text{Expression (3)}$$

18. The polarizing plate according to claim 1, wherein an absolute value of a difference between a log P of the second liquid crystal compound and a log P of the dichroic substance is 3.0 or more.

19. An organic electroluminescent display device comprising the polarizing plate according to claim 1.

* * * * *